United States Patent [19]
Hastings et al.

[11] Patent Number: 5,563,526
[45] Date of Patent: Oct. 8, 1996

[54] PROGRAMMABLE MIXED-MODE INTEGRATED CIRCUIT ARCHITECTURE

[75] Inventors: Roy A. Hastings, Allen; Todd M. Neale, Carrollton, both of Tex.; Brad Whitney, Anaheim, Calif.

[73] Assignee: Texas Instruments Incorporated, Dallas, Tex.

[21] Appl. No.: 176,731

[22] Filed: Jan. 3, 1994

[51] Int. Cl.$^6$ ............................................ H03K 19/173
[52] U.S. Cl. ............................................ 326/37
[58] Field of Search ........................... 307/465; 326/37

[56] References Cited

U.S. PATENT DOCUMENTS

| | | | |
|---|---|---|---|
| 4,952,934 | 8/1990 | Chiriatti | 341/142 |
| 5,107,146 | 4/1992 | El-Ayat | 307/465 |
| 5,196,740 | 3/1993 | Austin | 307/465 |
| 5,298,806 | 3/1994 | Sako | 307/465 |

Primary Examiner—Edward P. Westin
Assistant Examiner—Richard Roseen
Attorney, Agent, or Firm—W. Daniel Swayze, Jr.; W. James Brady III; Richard L. Donaldson

[57] ABSTRACT

A programmable mixed-mode circuit (180) has both digital (215,217) and analog (120,120',120") circuit portions. The digital portion (215,217) is provided by programmable digital logic. The analog portion (120,120',120") has a variety of analog circuits, including voltage references (218), high-speed comparators (208,209) and circuits (80) that are selectively configurable to provide operational amplifier or comparator functions. The analog circuits (122–125) are interconnected by programmable switch elements (128–131,160–167) so that the connection of the analog circuits to one another, to input or output pins (A0–A3,B0–B3,C0–C3) and to the digital circuitry (215, 217) can be programmed.

80 Claims, 12 Drawing Sheets

PROGRAMMABLE MIXED-MODE INTEGRATED CIRCUIT ARCHITECTURE

BACKGROUND OF THE INVENTION

1. Field of the Invention

This invention relates to improvements in programmable mixed-mode integrated circuit devices and architectures, and, more particularly, to improvements in programmable integrated circuit devices containing one or more analog circuits together with one or more digital circuits, in general, and selectable or programmable analog and digital circuits, in particular, and to methods for using and fabricating same.

2. Relevant Background Information

Fabrication of custom integrated circuits that involve one or more analog circuits is usually a costly and time consuming process. During the process, typically, a user or customer specifies the various analog functions and parameters needed to an integrated circuit manufacturer. Such parameters may include, for instance, input and output voltages, circuit operating voltages, various timing requirements, various voltage reference and comparing requirements, and so on.

With such device specifications, the manufacturer typically designs a custom circuit that includes the particular circuits necessary to meet the specifications outlined by the customer. Often several iterations of circuit design are required to achieve the exact circuit specified by the customer. It will be seen that this process can be time consuming, and, therefore, expensive. In addition, since each circuit is a custom design, additional design expense may be added to the final circuit cost.

Furthermore, oftentimes the circuit that is specified by the customer may need to be changed in one or more relatively minor aspects after the design has been completed, but such change is relatively impractical because the entire design process must be repeated to incorporate even minor design changes in a custom integrated circuit chip.

In addition to the above considerations, modern system designers face requirements for ever-increasing degrees of integration. Recently, desires have been expressed that entire systems be integrated onto a common substrate in order to reduce cost and increase reliability.

To address these problems, presently, two general VLSI fabrication approaches are employed, application-specific integrated circuit devices (ASIC devices) and programmable devices. Programmable devices are desirable because they require little initial investment and can be incorporated into systems quickly. In the digital realm, examples of programmable devices include microprocessors, microcontrollers, field-programmable gate arrays and field-programmable logic devices.

Many modern systems require integrating analog and digital components together to form a so-called "mixed-mode" system. Mixed-mode systems are difficult to implement in programmable form because the design of suitable analog subsystems is quite challenging, as there are more crucial parameters to consider in designing an analog system than in designing a digital system. Analog components are also more sensitive to noise and crosstalk, and generally require more power and semiconductor chip area than digital components. Because of the difficulty in designing with analog circuitry, most mixed-mode systems use analog elements primarily as an interface to a digital processing system. In practice, most of the complex analog circuitry is found on the inputs of the system, for many (if not most) real-world input parameters are analog in nature. On the other hand, for many systems, the outputs are largely digital, and do not require analog output drivers.

The classical analog interface into a mixed-mode system is the analog-to-digital (A/D) converter. An A/D converter samples the value of an analog input variable and then spends a finite time interval encoding the resulting value as a binary number. The amount of time required to complete one conversion is called the conversion time, $T_c$, the inverse of which being the conversion rate, $f_c$, of the converter. The precision of an A/D converter is limited by the resolution of the binary number it encodes, and, in fact, most converters are specified in terms of the number of bits used in their encoding scheme, generally between 4 and 20.

Several classes of A/D converters are available, including integrating, successive-approximation, and flash converters. Integrating and successive-approximation converters typically have 12 to 16 bits of precision, but are slow, with typical conversion rates range being from 10 KHz to 500 KHz. Flash converters are much faster, but have poorer precision, typically 6 to 8 bits.

Analog-to-digital converters also exhibit undesirable quantization effects. A 10-bit converter sampling a 0–10 V waveform, for example, may have 10 $mV_{pp}$ error on the signal. It is relatively easy to build pure analog systems which have less than 1 $mV_{pp}$ of error and noise, so the quantization error of an A/D converter can be of importance. The usual way to eliminate this problem is to use a 12-bit or 16-bit converter, but such circuits grow progressively more difficult to integrate as the bit count increases.

Another drawback to A/D converters is the problem of aliasing. Nyquist theory shows that a converter with a conversion rate of $f_c$ cannot extract reliable information from a signal with appreciable spectral content beyond 0.5 $f_c$ (the Nyquist rate). Because real-world signals often violate the Nyquist sampling criterion, a low-pass, or anti-aliasing, filter is usually placed before the converter. The filter usually has a multi-pole low-pass response, and can cause significant distortion of signals with frequencies on the order of 0.25 $f_c$. Thus, a practical A/D converter may have frequency limitations that are more severe than its conversion rate would indicate.

Furthermore, A/D converters are relatively large circuit blocks, even if they have only 10 or 12 bits of resolution. Thus, most integrated systems can include only one or two converters. Unfortunately, the number of analog inputs that must be monitored is usually much larger than the number of converters. Consequently, the analog inputs are usually multiplexed. Multiplexing leads to several undesirable effects. First, the conversion rate is greatly reduced. For instance, if N inputs are multiplexed into a single converter, the effective conversion rate for each signal will be $f_c/N$. Second, unless all signals are sampled simultaneously and are then held in some form of analog memory, a time skew will exist between the sampling of successive inputs to the multiplexer. If time or phase relationships between the signals are of importance, this skew may introduce very large errors. In practical systems, simultaneous sample-and-hold circuitry is almost mandatory for real-time processing of multiplexed inputs. This circuitry takes up yet more area on the semiconductor chip, and is susceptible to noise and drift effects.

A final problem with A/D conversion schemes is that many operations are much more difficult to perform in the digital domain than in the analog domain. When a converter is placed at the front of the mixed-mode system, these operations must be performed digitally. For example, a simple two-pole filter can be implemented in analog circuitry as a biquad, using one operational amplifier and four passive components. In the digital domain this operation is performed by computing solutions to a second-order linear differential equation. This problem is quite difficult to solve, and usually a microprocessor architecture is needed to achieve satisfactory numerical performance.

Of course, the A/D converter can be a useful analog interface for a limited class of applications. If only a few inputs need to be monitored, if resolutions are not particularly high, and if the frequencies involved are under 50 KHz, an A/D converter may be the best solution. However, even in such cases as these, a fairly complex digital system is needed to process the results of the A/D conversions. A mixed-mode system incorporating A/D converters is thus limited in performance and is very consumptive of semiconductor chip area and power.

Mixed-mode systems that are implemented using application-specific circuitry do not usually employ A/D converters, due to the problems discussed above. Instead, application-specific systems are generally partitioned into analog and digital sections. The analog circuitry performs continuous real-time processing using operational amplifiers and passive components. In some cases specialized circuitry (such as analog multipliers) is added to improve performance or reduce component count. Once the analog processing is complete, the resulting signals are usually converted into the digital domain by comparators. In a properly partitioned system, the digital circuitry does not have to emulate any continuous real-time function, so the complexities of numerical calculations are avoided. Instead, the digital circuitry is mostly used to implement timing and control functions, and to perform combinatorial logic.

The ASIC approach to mixed-mode systems has a number of advantages over approaches using A/D converters. For small- and medium-sized systems, the ASIC approach requires fewer components, and results in smaller, more cost-effective semiconductor chips. The effective propagation delays through the analog circuitry are often much smaller than through an A/D converter. If a signal must be processed quickly, it can usually be routed directly into a comparator, and the propagation delay through the analog circuitry can often be reduced to under 100 nS. Timing skews are usually fairly easy to eliminate, since the small size of comparators and operational amplifiers allows the use of large numbers of these components on a single semiconductor chip. Few ASIC circuits need multiplexers, so they avoid the complexity of simultaneous sample-and-hold circuitry. Also, the analog circuitry of an ASIC system generally has negligible quantization error.

Although these circuits may have offset voltages on the order of 1–5 mV, these are nearly time invariant. Because offsets are nearly time-invariant, compensation circuitry can largely eliminate them. Even if it is not practical to compensate for the offset, offsets are usually less objectionable than randomly fluctuating noise.

The main difficulty with the analog circuitry used in ASIC mixed-mode circuitry is that it cannot be reconfigured. The connections between components and the component values are largely chosen by the integrated circuit designer, and once the circuit is fabricated, they cannot be changed. Consequently, an ASIC circuit is usually only suitable for a very limited range of applications.

ASIC design methodologies therefore concentrate on reducing the cycle time for designing new integrated circuits, and simplifying the specification of this design. Unfortunately, integrated circuit design is by its very nature complex and time-consuming, and no amount of development is likely to make the cycle time and initial investment competitive with those required for programming a generic device. What is needed is a programmable analog circuit topology suitable for use with a mixed-mode system. If such a topology could be found, then the general approach used in ASIC mixed-mode systems could be used to fabricate a true programmable mixed-mode integrated circuit.

SUMMARY OF THE INVENTION

In light of the above, it is an object of the invention to provide an improved programmable or reconfigurable mixed-mode device on a single semiconductor chip, and, more particularly, to provide such a device that has both digital programmable logic functions and one or more analog circuits that are selected by programming of the digital programming logic functions.

It is another object of the invention to provide a programmable mixed-mode device which performs a majority of its analog signal processing using linear circuitry, thus reducing the need for digital signal processing.

It is another object of the invention to partition the analog and digital portions of a mixed-mode device to reduce or eliminate the need for analog-to-digital converters.

It is another object of the invention to provide a programmable mixed-mode device which reduces chip area and thus component cost by eliminating complex subsystems, such as digital signal processors, analog-to-digital converters, and the like.

It is another object of the invention to provide a programmable mixed-mode device which reduces pin count and package cost by enabling each pin to implement a multiplicity of functions.

It is another object of the invention to provide a generic programmable device that can reduce the development time for the production of a custom mixed-mode device.

It is another object of the invention to provide a reconfigurable analog circuit topology suitable for implementing a monolithic mixed-mode device in which the majority of signal processing is conducted using linear circuitry.

It is another object of the invention to provide analog circuits which can be used within a reconfigurable analog circuit topology, and which can be manufactured utilizing existing wafer fabrication and assembly techniques.

It is another object of the invention to reduce the susceptibility of analog signal processing circuitry to noise and crosstalk which are present in monolithic mixed-mode devices by localizing interconnectivity of analog signals.

It is another object of the invention to provide increased flexibility in reconfiguring analog circuitry while reducing the number of components and interconnections required.

It is another object of the invention to provide a device that contains a number of analog circuits that provide selected various analog circuit functions that can be rapidly programmed or reprogrammed by a user, or by the device itself, to enable more precise circuit operation as needed by particular user applications.

It is another object of the invention to provide a programmable device that contains analog circuits and analog circuit functions that enable programmable selection of reference voltages for the circuit.

It is another object of the invention to provide a programmable mixed-mode circuit in which power supply monitoring can be accomplished by analog circuitry to assure accurate digital operations over a wide supply voltage range.

It is another object of the invention to provide a programmable mixed-mode device in which functions that formerly were implemented in analog circuitry can be provided in digital circuitry with accuracy, and with reduced component size, number, and cost requirements.

An advantage of the invention is that relatively small, inexpensive, and low pin-count integrated circuits can be fabricated to perform a variety of functions now performed by custom ASIC devices.

Another advantage of the invention is that mixed-mode circuits can be quickly designed and redesigned by electrically-programming a generic integrated circuit, greatly reducing device development time.

Another advantage of the invention is that a single generic integrated circuit can replace many custom ASIC devices, since programmability allows the functionality of the device to be altered to meet the needs of a specific application.

These and other objects, features, and advantages, will be apparent to those skilled in the art from the following detailed description when read in conjunction with the accompanying drawings and appended claims.

The invention provides a programmable analog circuit topology suitable for use with a mixed-mode system. The topology can be used in ASIC mixed-mode systems, and to fabricate a true programmable mixed-mode integrated circuit. By providing a sufficiently flexible array of operational amplifiers and comparators integrated with a relatively small amount of programmable digital logic, a system can be provided that can perform a wide variety of small- and medium-level mixed-mode signal processing tasks. These circuits, combined with a few programmable timers, can fill most of the requirements for a digital subsystem. The problem of designing a programmable mixed-mode integrated circuit is thus reduced to the design of a suitable analog subsystem.

In one broad aspect of the invention, a circuit is provided that has both digital and analog circuit portions in which the analog circuitry monitors the power supply voltage to insure the digital circuitry produces an accurate output. This feature enables circuit functions to be implemented digitally that were very difficult to implement with analog circuitry alone. For example, a timing delay can be accomplished with analog components, but would be large and expensive. If a digital circuit were to be used, a simple counter can be used. Moreover, due to the presence of the analog circuitry to monitor the power supply voltage, the digital counter or timer can be relied upon to work more accurately than if the digital circuit alone were provided.

The ability of the circuit to monitor power supply voltages and locking out circuit operation until a particular voltage is reached enables the initialization of an associated circuit that may have a "trap state" to start in a desired state. For example, many circuits, such as arithmetic state machines, have potential "trap states", or degenerate hop states, which cannot always be avoided in circuit design. By virtue of the ability to monitor the power supply voltage, start up in a correct state can be ensured. Or, for instance, in many circuit designs, flip-flops, or similar circuits, may be provided that are set during a fault condition. By monitoring the voltage, and locking out circuit operation until a particular voltage is reached, the flip-flop can be initialized in a way that does not generate erroneous faults.

According to another broad aspect of the invention a programmable device is fabricated on a single semiconductor chip. The device has a circuit producing user programmable digital logic states, and at least one configurable analog circuit having an input and an output. Circuitry is provided for selectively configuring the analog circuit in accordance with the programmable digital logic states. The analog circuit may include configurable circuitry for controlling interconnectivity of the analog circuit, such as switches controlled by the digital logic states. In one embodiment, the analog circuit is formed of a plurality of configurable analog circuit blocks. At least one analog circuit may be an operational amplifier, a voltage comparator circuit, or preferably, a circuit that is selectively configurable either as an operational amplifier or a comparator in dependence upon the programmable digital logic states.

The analog circuits may be interconnected by analog signal paths whose interconnectivity also is determined by the programmable digital logic states. At least some of the signal paths interconnect outputs of at least some of the analog circuits to inputs of at least some of the analog circuits entirely on chip.

In a preferred embodiment, each switch used to interconnect the analog circuits is formed of a network of switches to provide a high degree of isolation when the switch not conducting. At least some of the switches are connected to selectively connect at least one input/output pin to an input of the analog circuit. At least some of the switches are connected to selectively route digital data to bypass the analog circuits so that digital data can be brought directly into the digital circuitry. The digital logic states also control at least some of the switches to connect outputs of the analog circuits that are compatible with digital logic levels to inputs of a digital function logic circuit without passing through any of the input/output pins.

In a preferred embodiment, the programmable device also has a digital functional logic circuit connected to process digital data within the programmable device. The digital functional logic circuit may be user programmed as a state machine that is responsive to data within the programmable device, and in one embodiment, is connected to be configured by the digital logic states. In another embodiment, the digital functional logic circuit may be connected to configure the digital logic states. The circuits to produce the digital logic states and the functional logic can be of any user programmable type, such as a PLA, an FPLA, a PLD, a PGA, an FPGA, or the like.

The programmable device may also include a plurality of binary counters arranged to perform counting, timing, and sequencing functions, and which are configured by the programmable digital logic states and supply signals to the digital functional logic circuit.

In accordance with another broad aspect of the invention, a programmable device is fabricated on a single semiconductor chip that has a circuit having user programmable digital logic states and a plurality of input/output pins. A plurality of analog circuits each has an analog input and an analog output, and a plurality of configurable interconnectivity controlling circuits is connected to enable one of the input/output pins selectively to one of at least two of the analog circuits. The circuit having programmable digital logic states is connected to the plurality of interconnectivity controlling circuits to connect a selected one of the input/output pins to a selected one of the analog circuits in accordance with the programmable digital logic states.

A number of the analog circuits are provided sufficient to provide a redundant number of analog circuits with respect to a number of input/output pins, whereby the number of analog switches which are needed to provide each device pin with connections to a multiplicity of analog circuits is reduced. The analog circuits are arranged wherein each input/output pin is selectively connectable to a subset of all analog circuits, and each analog circuit is selectively connectable to a subset of all of the input/output pins. A plurality of interconnection paths to the analog circuits are arranged to form a symmetrical network.

The switches are arranged to contain the minimum number of switches necessary to provide each input/output pin with a connection to an inverting input of an analog circuit, a noninverting input of an analog circuit, an output of an analog circuit. Also, additional switch networks are connected to selected inputs of each analog circuit so that an on-chip reference voltage can be selectively supplied to the analog circuit. At least some of the switches are connected to selectively route digital data to bypass the analog circuit. Other switches connect outputs of selected analog circuits to inputs of selected analog circuits without passing through any of the input/output pins.

In yet another broad aspect of the invention, a programmable device is fabricated on a single semiconductor chip that has a circuit having digital logic states and a circuit having functional logic states. A plurality of input/output pins are provided, as well as an analog circuit having an input and an output. A transmission gate is configured by the digital logic states to selectively connect the input/output pins to the circuit having functional logic states. An analog switch is configured by the digital logic states to selectively connect the input/output pins to the analog circuit in accordance with the digital logic states.

In one embodiment, a tristate digital output driver and at least a further analog switch connected between an input/output pin and the analog circuit, operated in response to the digital logic states to selectively isolate the input/output pin are provided, wherein the pin can be isolated from the analog circuit, and can function as a digital output by virtue of the connection to the digital output driver.

In still another broad aspect of the invention, a user programmable analog device is formed on a single semiconductor chip. The device has a user programmable digital logic array fabricated in the semiconductor chip that produces configuration signals in a configuration logic portion and data processing functions in a functional logic portion. A plurality of analog circuits are also fabricated in the semiconductor chip. Circuitry is also provided for selectively configuring the interconnections and functions of the at least one of the analog circuit in accordance with the configuration signals, and circuitry is provided for producing data processed in accordance with the data processing functions.

In accordance with yet another broad aspect of the invention, a method for fabricating an mixed-mode circuit having a plurality of input/output pins is presented. The method includes the step of providing an integrated circuit chip containing a plurality of analog circuits, a plurality of configuration switches that control the interconnections and functionality of the analog circuits and that configure the input/output pins to accept or provide analog or digital data, and a programmable digital logic circuit. The method includes the additional step of programming a portion of the digital logic circuit to produce configuration signals that operate the configuration switches to configure the analog circuits in a predetermined manner and to configure the input/output pins. The method also includes the step of programming another portion of the digital logic circuit to operate on digital data within the mixed-mode circuit. The programming steps may be performed by a user after the mixed-mode circuit is packaged, or by a manufacturer before the mixed-mode circuit is packaged.

In accordance with yet another broad aspect of the invention, a programmable integrated circuit powered by an externally applied power supply voltage is fabricated on a single semiconductor chip. A programmable digital circuit produces digital configuration signals. An analog voltage reference circuit connected to receive the power supply voltage produces an essentially constant reference voltage output over a range of voltages of the power supply voltage, and a voltage divider produces an output voltage in accordance with a resistor ratio. At least one switch is provided for changing the ratio in accordance with the digital configuration signals.

In accordance with yet another broad aspect of the invention, a programmable integrated circuit powered by an externally applied power supply voltage is fabricated in a single semiconductor chip. The circuit has a plurality of analog input and output circuits for receiving and delivering analog input and output signals, the analog input and output circuits being capable of being configured to provide a number of circuit functions. A plurality of switches selectively configure the analog input and output circuits to provide a selected circuit function from among the number of circuit functions. A digital logic circuit provides configuration signals for operating the plurality of switches to configure the analog input and output circuits to provide the selected circuit functions. A programmable digital circuit performs digital functions and produces a plurality of digital circuit output signals, and an analog voltage reference circuit is connected to receive the power supply voltage to produce an essentially constant reference voltage output over a range of voltages of the power supply voltage, the reference voltage being selectable by the configuration signals. The reference voltage output is connected to provide a reference voltage to at least one of the analog input and output circuits.

In one embodiment, the analog voltage reference circuit has a bandgap voltage reference circuit, and a resistor ladder having a plurality of nodes therealong. A transistor is connected in series from the externally applied power supply voltage to a reference potential through the resistor ladder. The transistor has a current flow path controlled by the bandgap voltage reference circuit. A plurality of switches are operated by the configuration signals, and are connected to select among the plurality of nodes of the resistor ladder to deliver the essentially constant reference voltage output at an output of the analog voltage reference circuit.

BRIEF DESCRIPTION OF THE DRAWING

The invention as illustrated in the accompanying drawing, in which.

In the various drawings, like reference numerals are used to denote like or similar parts.

DETAILED DESCRIPTION OF THE PREFERRED EMBODIMENTS

Figure 1:
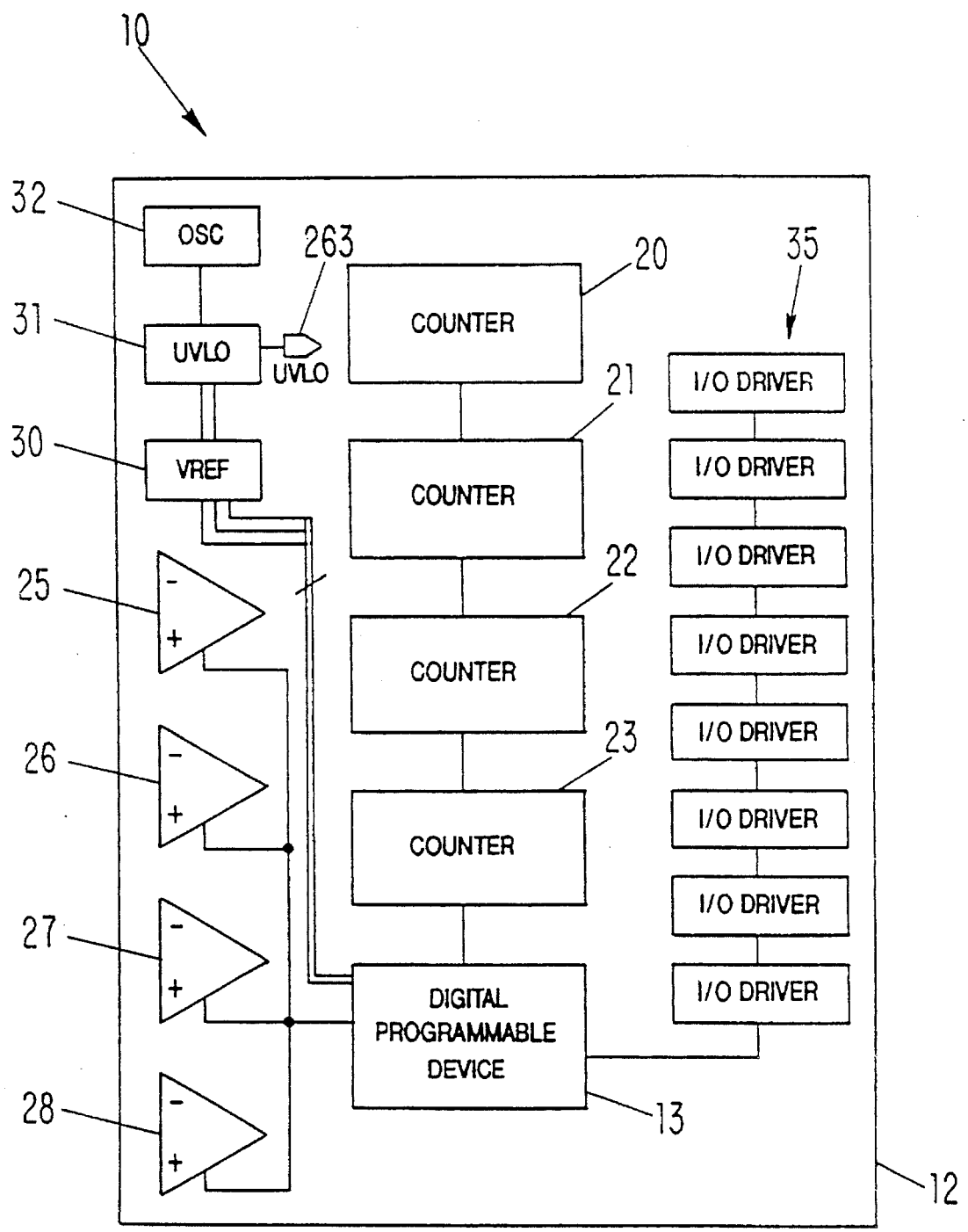
FIG. 1 is an abstracted block diagram illustrating a programmable device containing digital programmable logic functions and a number of analog circuits selectable by programming the digital programming logic functions, in accordance with a preferred embodiment of the invention.

With reference now to FIG. 1, a abstracted programmable integrated circuit device 10 is illustrated in block form. The device 10 provides a programmable or reconfigurable mixed-mode device on a single semiconductor chip 12, and, more particularly, provides such a device that has both digital programmable logic functions and one or more analog circuits that are selected or configured by programming of the digital programming logic functions. The device 10 includes digital programming logic 13 to perform digital computational tasks and, in addition, may be programmed to select and configure one or more of the digital and analog circuits also fabricated on the integrated circuit chip 12. The digital logic 13 can be, for example, a programmable logic array (PLA), a field programmable logic array (FPLA), a programmable logic device (PLD), a programmable gate array (PGA), a field programmable gate-array (FPGA) or other programmable logic block, known in the art. The various analog circuits 25–28 can be configured act as operational amplifiers, voltage comparators, or the like.

In the embodiment shown, four operational amplifier circuits 25–28 are formed on the integrated circuit chip 12 to which inputs can be variously selected through the programming of the logic functions of the digital logic 13. Also, since counting functions are widely useful in mixed mode circuits, four counters 20–23 are also fabricated on the integrated circuit chip 12 to supplement the digital logic block 13 to allow simplified implementation of timing or counting functions, if desired.

In addition, a voltage reference circuit 30, an undervoltage lock out (UVLO) circuit 31, and an oscillator 32 are formed on the integrated circuit chip 12. A number of input/output driver circuits 35 are included that can transmit or receive digital signals compatible with one or more digital logic families. Connections to the input/output driver circuits 35 may be made at selected various voltage levels, for example, to define outputs between the maximum voltage applied to the integrated circuit chip 12 or other desired output level. The input voltages also can be specified by selection of an appropriate one of the input/output drivers 35.

The interconnection of the several blocks of the circuit 10 is performed by configurable circuitry for controlling interconnectivity. The configurable circuitry may include one-time programmable elements, such as EPROM or EEPROM devices, fuses or antifuses, or the like. It will be appreciated by those skilled in the art that the circuit 10 is extremely flexible in the manner by which it can be configured, which can be accomplished, if desired, at the time of manufacture by means of application specific photolithography. Connection between analog circuits 25–28, I/o drivers 35, and other modules of the device is provided by a network of analog switches and digital transmission gates, not shown in this simplified diagram, but which are understood to exist, and are described below in detail. These switches and transmission gates are programmed to produce a desired functionality by means of a portion of the digital programmable logic 13. The analog switches are formed from a network of individual switches, each of which may independently lack sufficient blocking capability to prevent objectionable feedthrough of undesired signals, but which when connected together into a network cause the progressive attenuation of the undesired signals until the desired level of blocking is obtained, thus preventing objectionable crosstalk between separate signal paths within the device.

More particularly, the programmable mixed-mode circuit 10 of the invention can be considered a general-purpose analog building block designed to implement small systems with a minimum number of external components. The circuit can be implemented in a low pin-count package, for example, inside either a 16-pin or a 24-pin dual in-line package (DIP) or small outline (SO) package. The functionality of the circuit may be field-programmable, allowing both digital and analog circuitry to be configured for specific applications. One circuit package can replace a dozen or more separate integrated circuits in a system, allowing a high degree of integration while simultaneously keeping development time to a minimum. Since many circuit elements are available to the designer, including an analog voltage reference; an undervoltage lockout; comparators; operational amplifiers; high-speed digital logic; power drivers; counters and timers; undedicated MOS switches; piezo drivers; user-trimmed voltage dividers, and the like, the selective interconnection of circuitry of the programmable mixed-mode circuit allows the implementation of a wide variety of applications using a single integrated circuit. Moreover, the programmable mixed-mode device can perform a majority of its analog signal processing using linear circuitry, thus reducing the need for digital signal processing. Thus, for example, supply supervisors can be implemented using the voltage reference, comparators and undervoltage lockout (UVLO). Switch-mode power supply controllers can be built by using the power drivers along with the voltage reference and assorted comparators, operational amplifiers and logic. Additional applications include motor control, signal conditioning, alarm and monitoring functions, sequencing logic and microprocessor interfaces.

Each of the input/output terminals can function as an analog input, a digital input, an analog output or a digital output. Some I/O pins have additional functionality, such as the ability to drive high-current loads, or to function as inputs to high-speed comparators, as described below. Depending upon the user's application, each pin can be programmed to perform a specific function.

Figure 2:
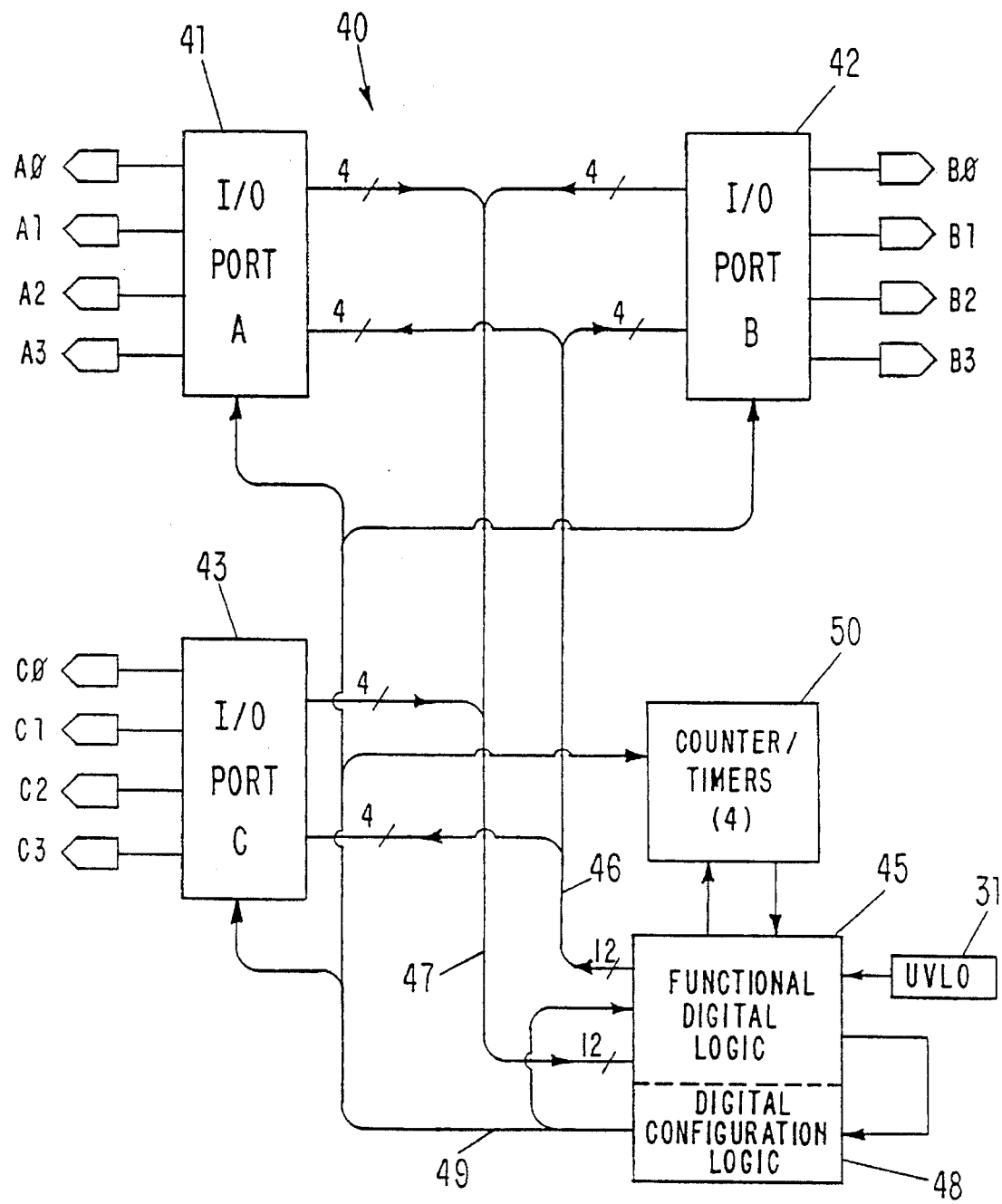
FIG. 2 is a generalized block diagram of the general architecture of a programmable mixed-mode circuit, in accordance with the invention.

More particularly, a simplified architectural representation 40 of a programmable 16-pin version of a mixed-mode circuit of the invention is shown in FIG. 2. Three input/output (I/O) ports 41, 42, and 43 connect to input/output terminals A0–A3, B0–B3, and C0–C3, and selectively deliver digital signals to or receive signals from a functional digital logic circuit 45 on buses 46 and 47. The functional digital logic circuit 45 can be implemented, for example, as a portion of a programmable logic array (PLA), or other programmable logic circuit as above described. The buses 46 and 47 can be divided to provide discrete bus sets to the I/O port circuits 41–43, as shown, and may provide, respectively, an output bus and an input bus on which digital signals from the I/O port circuitries 41–43 are carried.

In addition to the functional digital logic 45, a digital configuration or control logic section 48 is provided. The digital configuration logic circuit 48 can be implemented, for example, as another portion of the programmable logic array (PLA), or other programmable logic circuit as above described. The digital configuration logic circuit 48 is programmable to configure the circuitry of the I/O ports 41–43, as well as the other circuitry on the chip on which the overall device is fabricated to provide various selected functions, described with specificity below. Thus, control lines 49 are provided to the I/O ports 41–43 and to the counter/timer circuitry 50.

Thus, each I/O port 41–43 contains the input and output circuitry associated with one bank of four input/output pins, and contains both analog and digital components, so as to allow the processing of either sort of signals. Analog signals are processed entirely within the port circuitry, reducing noise and crosstalk between long signal runs on the semiconductor chip on which the circuitry is fabricated. By minimizing or eliminating global analog interconnectivity, not only are noise and crosstalk minimized, but the size and complexity of the switching network can be reduced. Although each pin implements only a subset of the total functionality of the device, by proper selection of pins and by the appropriate programming of the part, a higher degree of flexibility can be achieved.

It will be appreciated that although three I/O ports 41–43 are shown in the embodiment of FIG. 2, other versions of the programmable mixed-mode circuit of the invention can employ different numbers of I/O ports, counter/timer circuits, and the like, with appropriate modification to the number of package pins required and to the internal bus structure.

As mentioned, a group of four ten-bit counter/timers 50 is also accessed by the digital function logic circuit 45, and digital configuration logic circuit 48 allowing the programmable mixed-mode circuit of the invention to perform interval timing and/or event counting tasks, as desired.

The functional digital logic circuit 45 may be controlled by the digital configuration logic circuit 48, and, as shown, the digital configuration logic circuit 48 may also receive functional signals from the functional digital logic circuit 45, to essentially create a self-programming feature in the circuit. The functional digital logic circuit 45 may serve, for example, as a state machine that is moved from state to state by signals, for instance, from the one of the counter/timer circuits 50, or externally applied signals via one of the I/O ports 41–43, or other source. In some instances, it may be desirable to reconfigure the overall circuit upon the occurrence of a predetermined condition; for instance, if an undervoltage condition occurs, as indicated by the undervoltage lock-out (UVLO) circuit 31, it may be desirable for the configuration logic 48 to differently configure the I/O ports 41–43 to redirect the input signals. In such case, the functional digital logic circuit 45 might be switched to that state, and, in turn, the digital configuration logic circuit 48 may be reprogrammed to reconfigure the circuitry, as desired.

Figure 3:
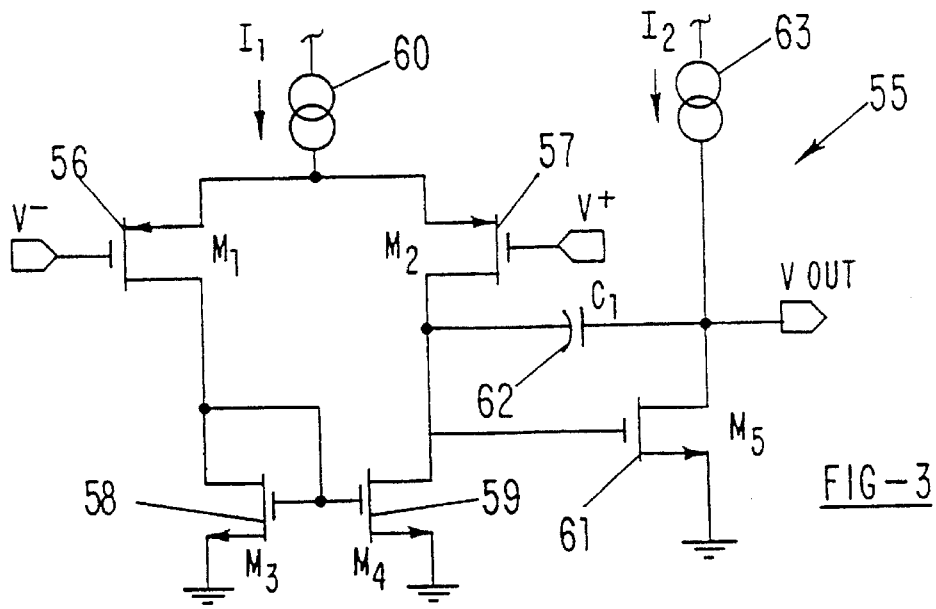
FIG. 3 is an electrical schematic diagram of an operational amplifier that can be used in construction of the analog input/output circuitry used in the programmable mixed-mode circuit of FIG. 2, in accordance with a preferred embodiment of the invention.

With reference now to FIG. 3, a schematic diagram of an operational amplifier 55 is shown that can be used in construction of the analog input circuitry 40 of FIG. 2. The operational amplifier includes four input stage MOSFETs 56–59, with input transistors 56 and 57 being connected to receive the input voltages V− and V+ on their respective gates. A current source 60 is connected to the current flow paths of the input transistors 56 and 57, thereby to provide a current, $I_1$, to be divided in accordance with the respective magnitudes of the input voltages V− and V+ in their respective current flow paths. The load transistors 58 and 59 are connected as a current mirror, with the current in transistor 59 mirroring the current that flows in transistor 58.

The output current path includes a MOSFET device 61 to which a current, $I_2$, is supplied by a second current source 63. An internal compensation capacitor 62 of value $C_1$ is connected between the drains of transistors 57 and 59 and the drain of transistor 61 to provide a single-pole rolloff characteristic, and the output signal $V_{OUT}$ is derived at the drain of the MOSFET 61.

Figure 4:
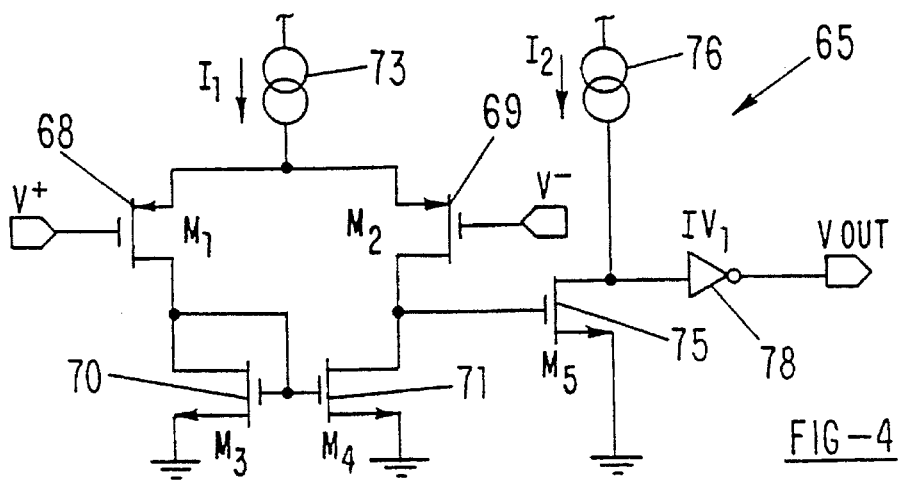
FIG. 4 is an electrical schematic diagram of an comparator that can be used in construction of the analog input/output circuitry used in the programmable mixed-mode circuit of FIG. 2, in accordance with a preferred embodiment of the invention.

With reference to FIG. 4, a schematic diagram of an comparator 65 is shown that can be used in construction of the analog input circuitry 40 of FIG. 2. The comparator 65 includes four input stage MOSFETs 68–71, with input transistors 68 and 69 connected to receive the input voltages V+ and V− on their respective gates. A current source 73 is connected to the current flow paths of the input transistors 68 and 69, thereby to provide a current, $I_1$, to be divided in accordance with the magnitudes of the input voltages V+ and V− in their respective current flow paths. The load transistors 70 and 71 are connected as a current mirror, with the current in transistor 71 mirroring the current that flows in transistor 70.

The output current path includes a MOSFET device 75 to which a current, $I_2$, is supplied by a second current source 76. The output signal $V_{OUT}$ is derived by a CMOS or NMOS inverter 78 at the drain of the MOSFET 75.

It can be seen that the circuits 55 and 65 of a simple operational amplifier (FIG. 3) and a simple comparator (FIG. 4) are similar. Thus, a single circuit can be made that can perform either or both tasks. The operational amplifier and the comparator differ primarily in the presence of the capacitor 62 in the circuit 55 of FIG. 3 and the presence of the inverter 78 in the circuit 65 of FIG. 4.

The capacitor 62 compensates the operational amplifier by inserting a dominant pole to roll off the high-frequency gain. However, in a comparator, such dominant pole is not desired since it increases the propagation delay and lowers the slew rate of the circuit. The comparator uses the inverter 78 to convert the voltage on the drain of MOSFET 75 into a CMOS logic-level signal. The inverter 78 also adds additional gain in the circuit of the comparator 65 to help reduce the time the output spends in transition between valid logic states.

Figure 5:
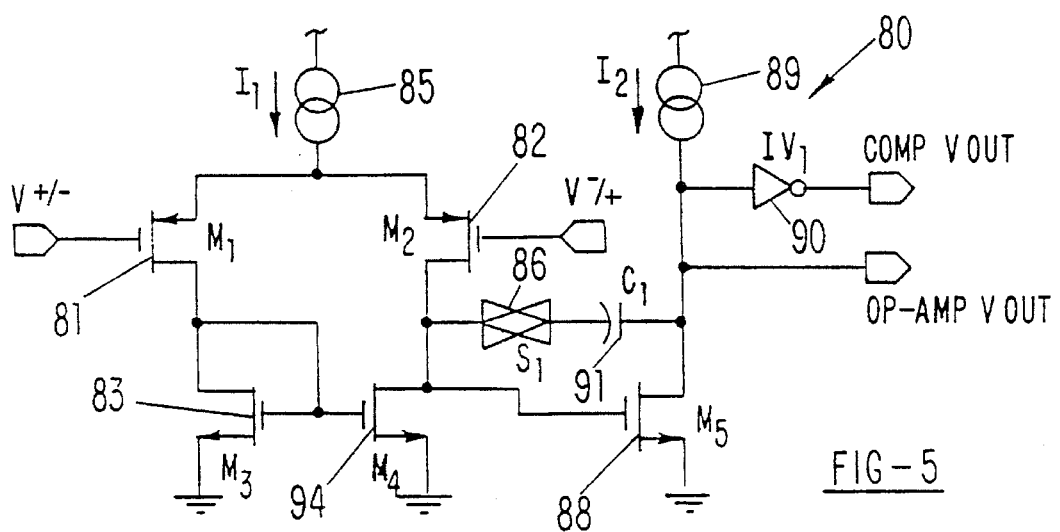
FIG. 5 is an electrical schematic diagram of a circuit that can be programmed to function as either a comparator or an operational amplifier, for use in construction of the analog input/output circuitry used in the programmable mixed-mode circuit of FIG. 2, in accordance with a preferred embodiment of the invention.

Accordingly, a circuit 80 that can be programmed to be either a comparator or an operational amplifier is shown in FIG. 5. The circuit 80 includes four input stage MOSFETs 81–84, with input transistors 81 and 82 connected to receive the input voltages V+/− and V−/+ on their respective gates. A current source 85 is connected to the current flow paths of the input transistors 81 and 82, thereby to provide a current, $I_1$, to be divided in their respective current flow paths in accordance with the magnitudes of the input voltages V−/+ and V+/−. The load transistors 83 and 84 are connected as a current mirror, with the current in transistor 84 mirroring the current that flows in transistor 83.

The output current path includes a MOSFET device 88 to which a current, $I_2$, is supplied by a second current source 89. A comparator output signal, COMP $V_{OUT}$, is provided by an inverter 90 at the drain of the MOSFET 88. Additionally, an internal compensation capacitor 91, of value $C_1$, is connected in series with a bilateral switch 86 providing a connection to the drains of transistors 82 and 84 to selectively provide compensation for an operational amplifier output, OP-AMP $V_{OUT}$, at the drain of the MOSFET 88 when the bilateral switch 86 is turned on. In the state in which the compensating capacitance is enabled, the circuit seen from the drain of MOSFET 88 appears to be an operational amplifier. As will become apparent below, the bilateral switch 86 is controlled by signals from the digital configuration logic circuit 48, so that the device with which the operational amplifier-comparator circuit 80 is associated can be programmed to select the desired function of the circuit 80.

It should be noted that the circuits of FIGS. 3–5 are merely examples of circuits that can be used, and, while the circuit of FIG. 5 has reduced performance figures from more sophisticated operational amplifier or comparator designs, the same principle of merging operational amplifiers and comparators can be applied to more sophisticated topologies.

Accordingly, in order to form an array of operational amplifier-comparator circuits, a network of interconnections is made through analog switches. In such network, however, concerns about crosstalk and feedthrough need to be addressed. Crosstalk may occur when two leads run parallel to one another on a semiconductor chip. A rapidly changing voltage on one lead may couple into the other lead through interlead capacitances. Moreover, some of the inputs to the operational amplifier-comparator circuit array are likely to be high-speed pulsed signals, while other inputs are constant potentials which must be carefully controlled.

This potentially serious crosstalk problem can be reduced by using a polysilicon or metal layer to form an electrostatic shield between the leads that may be affected. However, this may not be practical on long lead runs, since such a layer greatly increases capacitance in the affected lead and takes considerable amounts of space.

Another, more viable, method of reducing crosstalk is to avoid long leads which run parallel to one another. Thus, the arraying scheme for the operational amplifier-comparator circuits should avoid running many analog leads parallel to one another. This suggests that connectivity should be localized so that each signal connects to a minimum number of other nodes to prevent long leads and the associated crosstalk concerns. By localizing connectivity of analog signals, significant reductions in chip area can also be obtained.

In addition to the crosstalk problem, the switches used to isolate nodes in the array may be susceptible to feedthrough due to capacitive coupling between input and output, particularly since modern logic circuitry employs very rapid slew rates. A simple analog switch has appreciable drain-source capacitance, primarily through the backgate, and may not be adequate to block feedthrough.

Figure 6A:
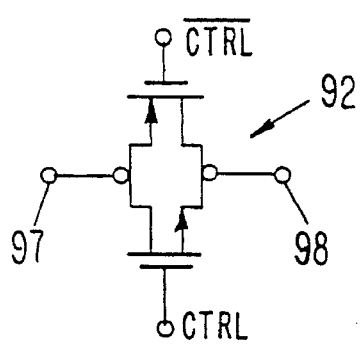
FIG. 6a is an electrical schematic diagram of a bidirectional switch.
Figure 6B:
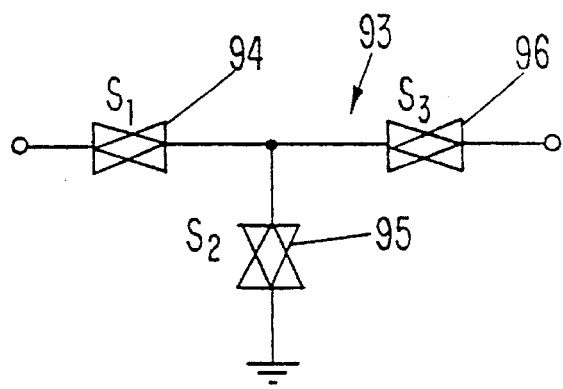
FIG. 6b is an electrical schematic diagram of a bidirectional switch arrangement particularly suited for use in the programmable mixed-mode circuit of the invention.

An electrical schematic of a simple analog bidirectional switch 92 that can be used in the construction of the circuit of the invention is shown in FIG. 6a, connected between input and output nodes 97 and 98. For additional closed switch attenuation, a preferable analog bidirectional switch embodiment is shown in FIG. 6b, in which three bidirectional analog switches 94–96, each constructed in the manner shown in FIG. 6a, are connected in a "tee" configuration to form a composite switch 93. Additional switch stages may be added if additional attenuation is needed. When the composite switch 93 is enabled, switches 94 and 96 are on and switch 95 is off. In this state, this circuit passes the analog signal from input to output just as would a simple analog bidirectional switch. On the other hand, when the composite switch 93 is disabled, switches 94 and 96 are off and switch 95 is on. Because switch 95 is on, any capacitive coupling through switches 94 or 96 is largely shunted to ground. In addition to the reduction in capacitive coupling provided by the switch embodiments shown, a preferred solution in the design of a connectivity network uses a minimum number of switches consistent with localizing the architecture of the network.

The preceding description provides for the formulation of a concise set of requirements for the analog input structure according to the invention. In sum, the architecture comprises an array of operational amplifier-comparator circuits, with the length of analog signal runs minimized to as great a degree as possible. In addition, connectivity is achieved via a minimal network of analog switches that are designed to reduce deleterious feedthrough coupling. Attempts to establish even a partial global connectivity are avoided, since such global connectivity would likely result in long signal runs and more than a minimal network of switches. More subtly, any attempt to establish global connectivity would increase signal run length and switch count geometrically, while purely local connectivity would increase them only arithmetically. Accordingly, the array of operational amplifier-comparator circuits in a preferred embodiment of the invention consists of small clusters of elements which have only local connectivity.

Another technique that reduces the need for large numbers of redundant switches is to use more than the minimal number of operational amplifier-comparator circuits. Connectivity is then partially determined by the operational amplifier-comparator circuit count. The tradeoff is that operational amplifier-comparator circuits are much larger than analog switches. However, doubling the number of operational amplifier-comparator circuits is likely to reduce the switch count by considerably more than a factor of two, since each amplifier-comparator circuit has multiple pins. A high degree of symmetry is also useful in reducing redundancy in the switch network, so that a solution that has the highest degree of symmetry possible consonant with the other requirements is a preferred solution.

The minimum number of pins which can enter a cluster is three, since access to all three terminals of an operational amplifier may be required. Three is an awkward number for constructing symmetrical designs, so according to the invention, the number of pins in a cluster is increased to four, to allow a higher degree of symmetry. With the number of pins decided, the number of operational amplifier-comparator circuits per pin is then determined. A straightforward answer is one per pin.

The final question is how many functions each pin should perform. For general programmability, each pin should certainly be available as an output of an operational amplifier-comparator circuit. Thus, each pin serves at least two functions, input and output. Since there are twice as many inputs to operational amplifier-comparator circuits as pins, each pin connects to at least two inputs.

Figure 7:
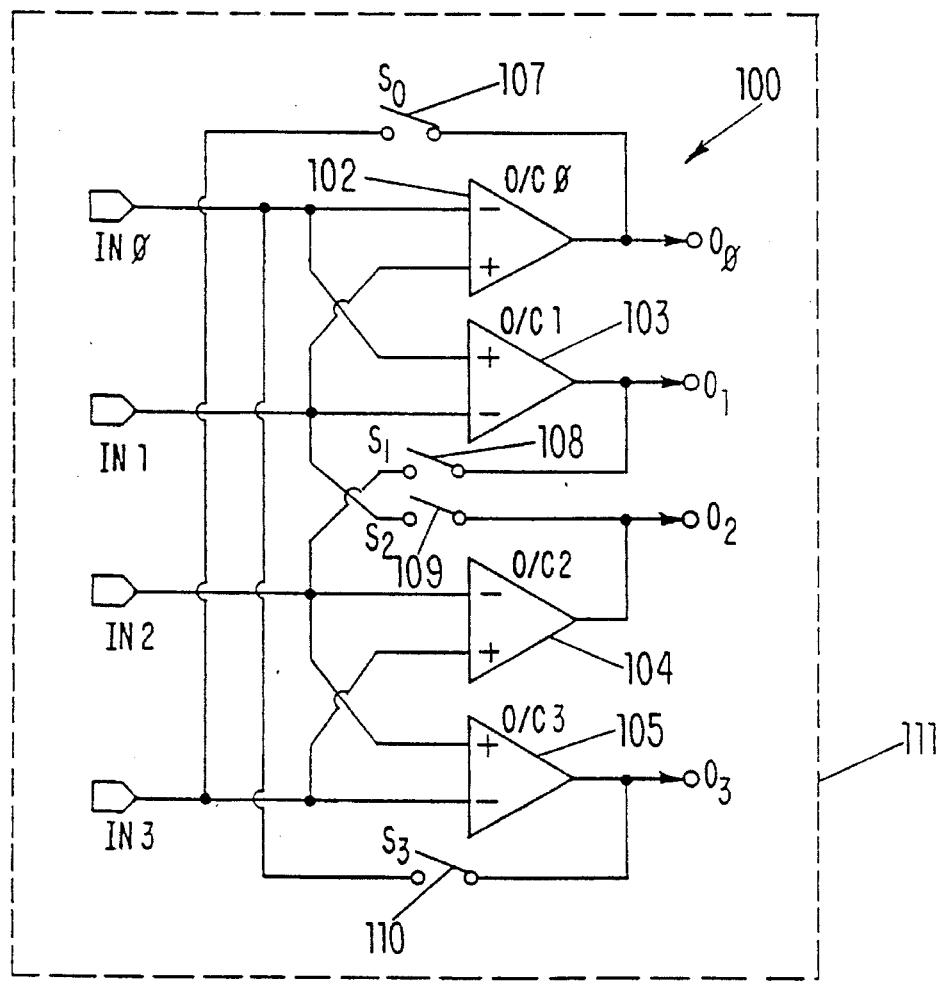
FIG. 7 is a conceptual electrical schematic diagram of an analog input module incorporating a plurality of circuits of FIG. 5 that can be programmed to function as either a comparator or an operational amplifier, for use in the programmable mixed-mode circuit in accordance with the invention.

In light of the above design considerations, a network embodiment of operational amplifier-comparator circuits 100 is shown in FIG. 7, which can be integrated on a semiconductor chip, denoted by the dotted line 111. Four operational amplifier-comparator circuits 102–105 are connected by four analog switch sets 107–110 to four input pins IN0–IN3, and to four output pins $O_0$—$O_3$. The input pins IN0–IN3 correspond to four input/output pins to the integrated circuit and the four output pins $O_0$–$O_3$ correspond to outputs on board the chip for connection to a bus to the digital configuration logic circuitry 48 (see FIG. 2). Each of the analog switch sets 107–110 can be constructed in the manner shown in FIG. 6b, with each formed of three bidirectional switches, using a three-element composite topology to reduce crosstalk between channels. The switches 107–110 not only configure the connections to the inputs and outputs of the respective amplifier-comparator circuit 102–105 with which they are associated, they also allow analog and digital signals to be selectively routed through the same port. Thus, for example, switch 107 can selectively interconnect the input terminal IN3 directly to the output line $O_0$, allowing digital signals applied to the input terminal IN3 to be bypass the operational amplifier-comparator circuits 102 and 105. The switches 108–110 may be similarly operated. Additional switches (not shown) may also be provided to selectively disconnect the outputs of the operational amplifier-comparator circuits 102–105 to contain analog signals to the network 100 and its input/output terminals IN0–IN3.

Larger arrays can be created, if desired, in multiples, for example, of four operational amplifier-comparator circuits, like the circuit 100, with connectivity remaining local to each cluster of four. A network constructed in this manner has a two-fold degree of symmetry. The first symmetrical relation is forced by the requirement of two connections from each pin to each comparator. One connection pattern with a high degree of symmetry that can be used is shown in FIG. 7. Because this connection pattern connects the operational amplifier-comparator circuits in pairs, the outputs are also cross-connected between pairs to achieve a second level of symmetry. The resulting circuitry allows any pin to be the output of an operational amplifier-comparator circuit, the negative input, or the positive input.

This network has fewer switches than a network that would connect any pin to any terminal of any of the four operational amplifier-comparator circuits. This minimization enables the number of switches and the length of runs to be reduced, yet does not impair the usefulness of the array, since all four pins can be readily utilized. This arrangement, however, constrains the patterns of pin numberings that are available to the user. For example, if the user uses the pin IN0 as the output of the operational amplifier-comparator circuit 105, this constrains the choice of inputs to pin IN2 (positive input) and pin IN3 (negative input).

Another consideration in the circuit 100 of FIG. 7 is feedthrough across the input stages of the operational amplifier-comparator circuit input stages 102–105. The operational amplifier-comparator circuit input stages are differential pairs (see FIG. 5). Because of offset concerns, the transistors employed are large, and therefore have comparatively large gate-source and gate-backgate capacitances. If a signal having a fast rise-time is connected to one input, this signal may inject charge across the differential pair and into the other input, upsetting the voltage present at this node. Because of the widespread use of resistive bias networks with rather high impedances to limit power consumption, charge injection of this sort may be a noise concern. This is particularly true with modern logic families, which routinely achieve transition times below 3 nsec. One solution to this problem is to avoid passing digital logic signals to an operational amplifier-comparator circuit, as below described.

These amplifier-comparator circuits are designed to interface to analog signals that usually have much slower slew rates than digital circuits. Thus, each input pin may have associated with it a digital gate (described below with reference to FIGS. 8) that can be used to bypass the analog circuitry if the pin is needed as a digital input. A bidirectional analog composite switch of the type described with reference to FIG. 6b can then be used to close off the path to the operational amplifier-comparator circuit, substantially eliminating charge injection across the differential pair. It should also be noted that in contrast to classical analog interface into a mixed-mode system that use analog-to-digital (A/D) converters, the invention enables the analog and digital portions of the mixed-mode device to be partitioned to reduce or eliminate the need for analog-to-digital converters.

Another consideration is that the basic topology of an integrated circuit of the type shown in FIG. 7 may require that bias voltage connections for every operational amplifier-comparator circuit 102–105 be brought outside the semiconductor chip on which the device is fabricated. This is particularly true, since, in many cases, many practical operational amplifier and comparator circuits bias one input to a reference voltage. Since voltage references are easily integrated, at least one bias voltage should be provided internal to the chip. By means of an analog switch, this bias voltage can be selectively applied to an appropriate terminal of the operational amplifier-comparator circuit. Connection to the positive input is generally advantageous, since operational amplifiers normally are run in negative feedback configuration. This connection does not impair the usefulness of a comparator, since the digital output of the comparator can be easily inverted in the following digital logic.

Figure 8:
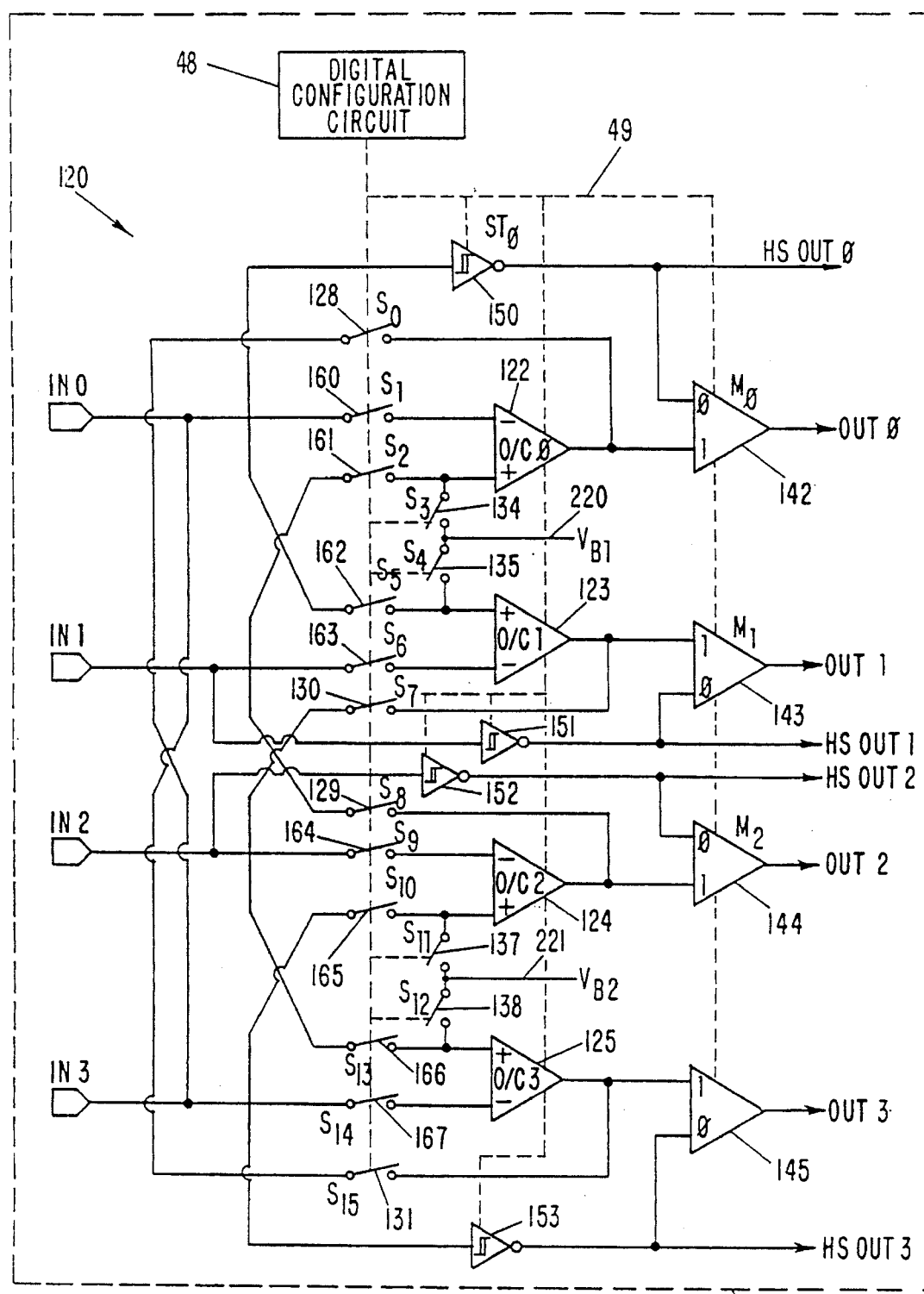
FIG. 8 is an electrical schematic diagram detailing the implementation of the analog input module of FIG. 7 used in the mixed-mode circuit, in accordance with a preferred embodiment of the invention.

Accordingly, a detailed network embodiment 120 of an input/output port incorporates additional switches to selectively connect a bias voltage to respective inputs of the operational amplifier-comparator circuits 122–125, as shown in FIG. 8. The network embodiment 120 has four operational amplifier-comparator circuits 122–125, constructed in the manner described above with reference to FIG. 5. Connections may be selectively made by four analog switch sets 128–131 between the four input/output pins IN0–IN3 and the outputs of the operational amplifier-comparator circuits 122–125. In addition, further switch sets 160–167 are provided to symmetrically connect selected ones of the input pins IN0–IN3 to the operational amplifier-comparator circuits, as shown, to provide additional circuit configuration flexibility and enhance its ability to be isolated. By opening switches connected to an operational amplifier circuit, feedthrough across the input pair of the operational amplifier-comparator is prevented. Again, each of the analog switch sets 128–131 and 160–167 can be constructed as shown in FIG. 6b, each formed of three bidirectional switches, using a three-element T-topology to reduce crosstalk between channels, allowing analog and digital signals to be selectively routed through the same port. Also, by virtue of the arrangement of the switch sets 128–131 and 160–167, each input pin can be selectively connected to inputs of two operational amplifier-comparator circuits.

Moreover, switches 134 and 135 are connected to selectively connect a bias voltage $VB_1$ to the non-inverting input of amplifier-comparator circuits 122 and 123. Likewise, switches 137 and 138 are connected to selectively connect a bias voltage $VB_2$ to the noninverting input of operational amplifier-comparator circuits 124 and 125. The bias voltages $VB_1$ and $VB_2$ on lines 220 and 221 can be derived from the reference voltage circuitry 218, described below with reference to FIG. 10, contained within the semiconductor chip 140 on which the circuit 120 is integrated. A requirement that a minimum number of analog switches be connected to each signal node restricts how many switches are used to connect the bias voltages, but $VB_1$ and $VB_2$ might be selectable via a series of taps on a resistor divider, below described, or some similar scheme.

In the embodiment shown in FIG. 8, the inputs of stages 122 and 124 are designed to be ground-sensing, while the inputs of stages 123 and 125 are designed to be supply-sensing (in contrast, for example, to the circuit embodiment of FIG. 5, which is ground sensing). Although none of the operational amplifier-comparator circuits have rail-to-rail sensing capability, they may be protected against phase reversal so long as the inverting input stays at least one volt above ground or below the supply (as applicable). For example, since stage 122 is ground sensing, both inputs can be held near ground without disrupting operation. If the noninverting input were tied to $V_{CC}$, the output would go to a high state and remain there so long as the inverting input remains at least one volt below $V_{CC}$.

The circuit 120 of FIG. 8 also shows one possible implementation for extracting or bypassing digital signals from or around the analog subsystem. A series of four multiplexers 142–145 are connected to select whether a given output line OUT0–OUT3 accepts input from one of the respectively associated operational amplifier-comparator circuits 122–125, or from a respective digital gate, or Schmidt trigger, 150–153 that bypasses an associated operational amplifier-comparator circuit. Since these gates switch at LSTTL voltage thresholds, but incorporate hysteresis to provide a high level of noise immunity, they can interface with TTL, LSTTL or CMOS logic systems. The output of the Schmidt trigger can be passed through a respective one of multiplexers 142–145 into the digital circuit, below described. This path totally avoids the analog circuitry, resulting in a significant decrease in propagation delays. It will be appreciated that due to the symmetrical connection of pairs of operational amplifier-comparator circuits 122–125, bypassing one operational amplifier-comparator circuit does not render the other pins useless; rather the other pins can be routed into alternative operational amplifier-comparator circuits.

If desired, the outputs from each of the Schmidt trigger circuits 150–153 can be routed directly to an input bus of the device, for example on lines HSOUT0-HSOUT3. These signals bypass all of the circuitry, except the Schmidt trigger circuits 150–153; consequently, they can be used in high speed applications in which circuit delays are avoided.

In operation, by closing the selected switches, a variety of different functions can be implemented. For example, if switches 160 and 161 are closed, then the operational amplifier-comparator circuit 122 can be used as a comparator by which the analog signals applied to the two inputs IN0 and IN1 can be compared to generate a digital signal. The digital signal can be routed through the multiplexer 142 to the digital circuit, below described. Alternately, instead of closing switch 161, switch 134 can be closed. The noninverting input of the operational amplifier-comparator circuit 122 now is connected to the internal bias voltage, VB1.

As a further example of operation, if switches 128, 160, and 161 were all closed, the operational amplifier-comparator circuit 122 could be used as an operational amplifier. The analog signal never leaves the input circuitry associated with the port, so crosstalk and digital noise are reduced. The operational amplifier-comparator circuit 122 could also be used as an operational amplifier if the switches 160, 134 and 128 were closed. In this case, the positive input is connected to a bias voltage, which acts as a virtual ground.

It should be noted that virtually all of the components of the circuit 120 are controlled by the configuration signals on bus 49 from the digital configuration circuit 48. Consequently by the user programming the digital configuration circuit to provide the necessary circuit configuring states that appear on the control bus 49, the circuit 120 can be configured to perform any one or more of a myriad of diverse circuit functions.

Moreover, a sufficient number of similarly constructed clusters of four user configurable operational-amplifier-comparator circuits can perform the same task as any stand-alone network of operational amplifiers and comparators. Because of the symmetry employed in connecting the components together, each pin can be employed in at least one mode of operation. In fact, a single pin can be used perform two functions, as output to one operational amplifier-comparator circuit and input to another. The concepts discussed above and implemented in the circuit of FIG. 8 provide a workable analog input module to serve, for example as circuitry to provide one of the I/O ports 41–43, described above with reference to FIG. 2.

Figure 9A:
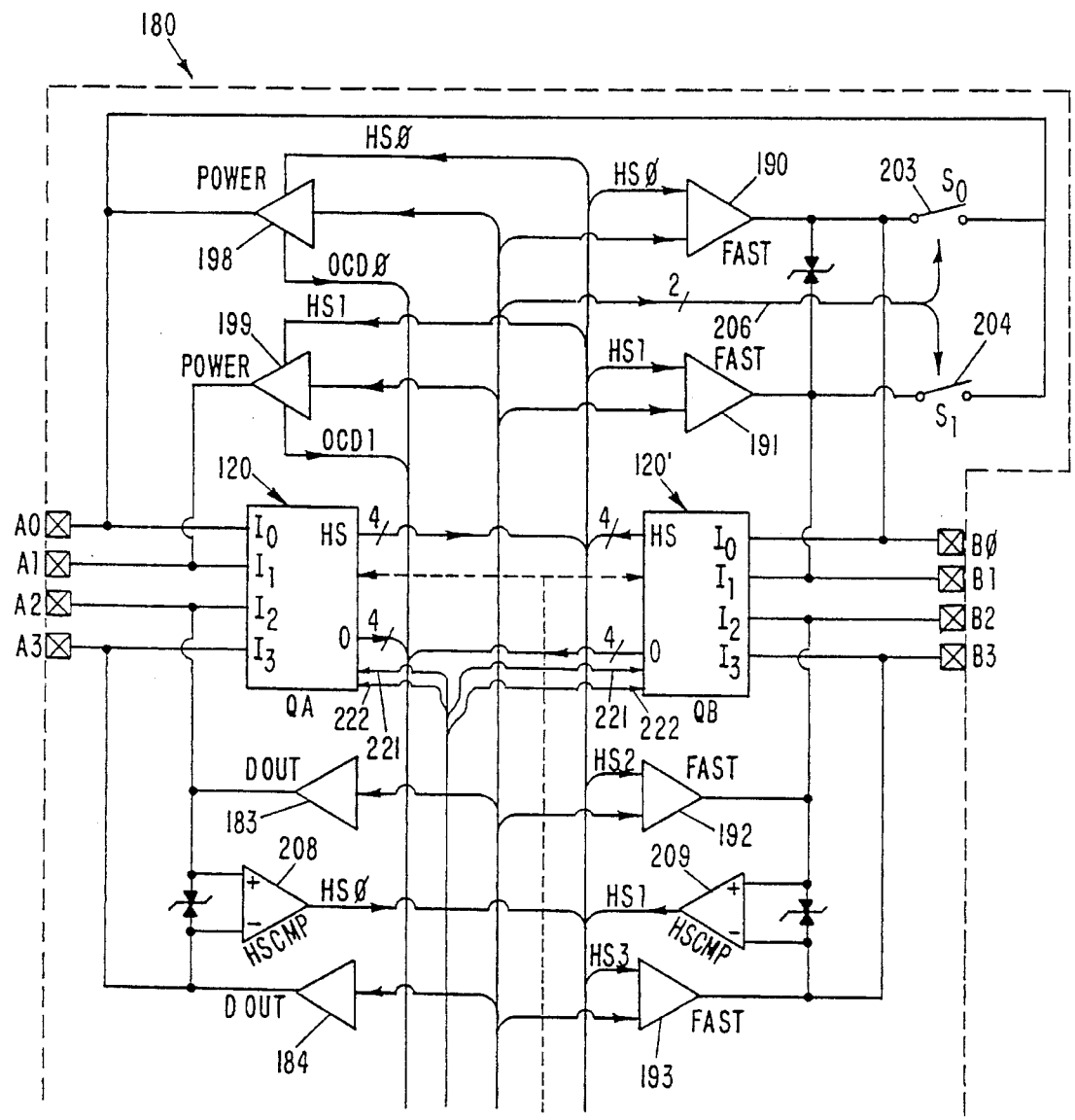
FIGS. 9a and 9b are is a detailed block diagrams of a general architecture of the programmable mixed-mode circuit of FIG. 2 using the input module of FIG. 8, in accordance with the invention.
Figure 9B:
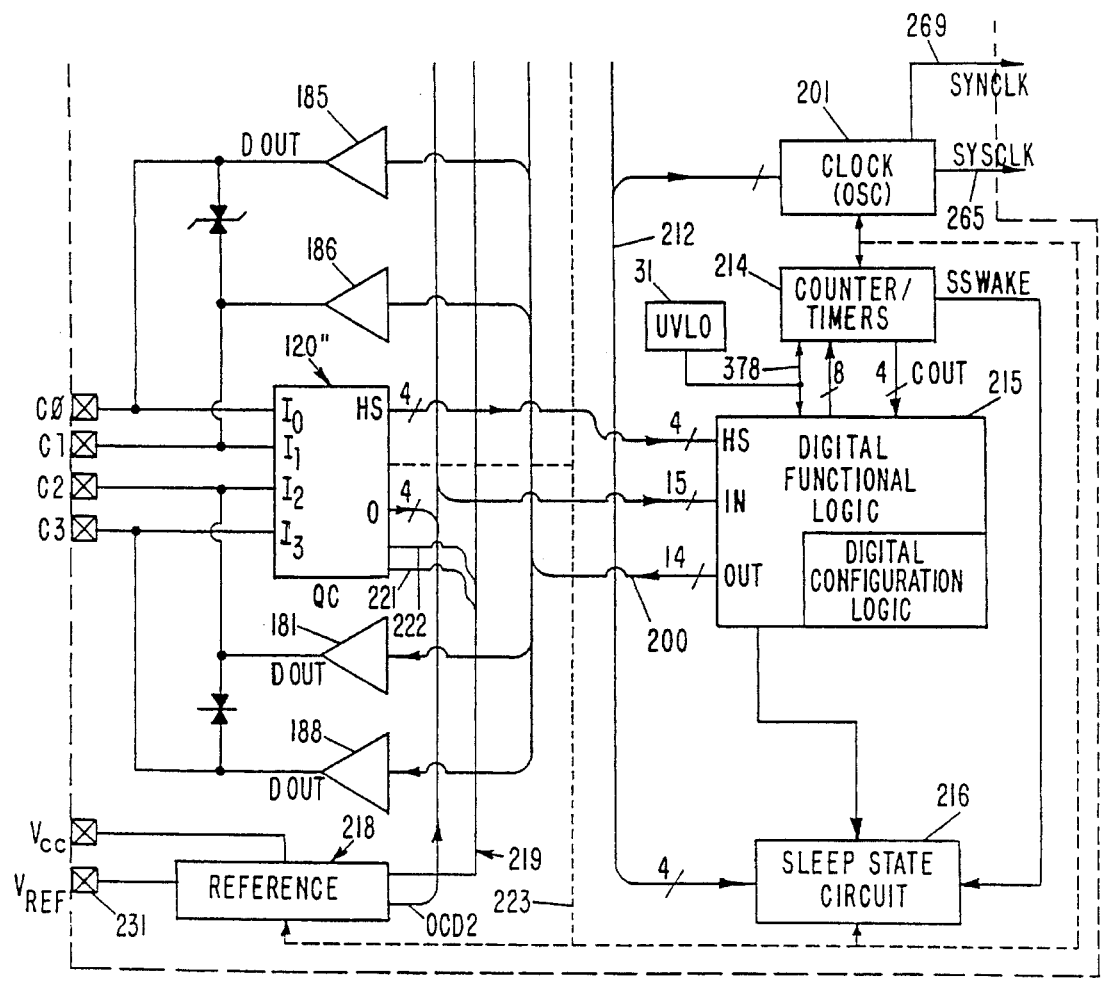

The general architecture of a complete programmable mixed-mode circuit 180 according to a preferred embodiment of the invention is shown in FIG. 9. The circuit 180 is integrated on a semiconductor chip denoted by the dotted line 181. The circuit 180 is a mixed-mode circuit that provides a capability to process both digital and analog signals, and is configurable to provide a variety of signal processing capabilities.

The circuit 180 has three operational amplifier-comparator blocks or networks 120, 120' and 120", as described above, functional and configuration digital logic circuits 215 and 217, a master clock or oscillator circuit 201, counter timer circuits 214, a voltage reference generator 218, and various other input and output support circuits, all as below described in detail.

The input/output circuitry for each port is provided by an operational amplifier-comparator circuit block or network, represented by boxes 120, 120' and 120" each of which being similarly constructed to contain the circuitry described above with reference to FIG. 8. Thus, the circuit 180 contains twelve configurable operational amplifier-comparator circuits, each constructed as described above with reference to FIGS. 5, 6b, and 8.

Each I/O pin (A0–A3, B0–B3, and C0–C3) also has a respective output driver, of various construction, as shown. In the embodiment illustrated, six of the I/O pins, A0, A1, B0, B1, B2, and B3, are dedicated drivers, while the remaining pins are undedicated digital outputs. The undedicated drivers are designed to be general-purpose digital interface lines. The output drivers 183–188 are undedicated digital logic output drivers (DOUT drivers), the output drivers 190–193 are high-speed asynchronous drivers (FAST drivers), and the output drivers 198–199 are high-power half-H drivers (POWER drivers).

The circuit 180 has two specialized high-speed comparators 208 and 209. These comparators are connected between specific pairs of pins, high speed comparator 208 being connected between pins A2 and A3, and high speed comparator 209 being connected between pins B2 and B3. The high-speed comparators 208 and 209 drive specific lines HS0 and HS1 in the high-speed bus 212.

The circuit 180 includes two undedicated MOS switches, 203 and 204. These switches are controlled by the functional digital logic circuit 215, via dedicated output lines 206 driven from resynchronized outputs from the functional digital logic circuit 215. The two MOS switches 203 and 204 allow the user, for instance, to implement battery controller functions. The switch 203 connects between pins A0 and B0, and the switch 204 connects between pins A0 and B1.

In a manner similar to that described above, configuration signals from the digital configuration logic circuit 217 are provided on bus 223 to selectively configure the various configurable circuits and circuit interconnections of the circuit 180.

Thus, a user can acquire the circuit 180 in a "generic" unprogrammed state, then program the digital configuration logic circuit to provide control or configuration signals on the configuration bus 223 that configures the circuit in a desired, or custom way for the particular user application. This is, of course, of advantage to the user, since the costs and time for acquiring a custom part for a particular application has been largely eliminated.

The particular manner by which the configuration digital logic circuits may be programmed is not shown, but may be accomplished by many suitable known techniques. For example, switching circuitry may be provided to redirect signals applied to the input pins to the digital configuration logic circuit 217 to sequentially write programming data into it, until a particular voltage is applied to a particular pin combination, indicating that the programming is complete. The completion indicating voltage changes the state of the redirecting switches to configure the digital configuration logic circuit 217 to its normal operating state. Other techniques are below described in greater detail.

Additionally, digital signals within the circuit 180 are operated on or responded to by the functional digital logic circuit 215. The functional digital logic circuit 215, provides output signals to these output drivers through a dedicated bus 200 that is synchronized to an on-board master clock source 201. The functional digital logic circuit 215 may be programmed to serve as a traditional state machine, or provide other digital functions on the data presented to it. The particular configuration or function provided by the functional digital logic circuit 215 is substantially entirely selectable by the user, who can program the circuit, as desired.

The digital functional logic circuit 215 in a preferred embodiment of the invention is implemented as a programmable logic array (PLA) that incorporates twelve state latches into an algorithmic state machine (ASM). The algorithmic state machine can incorporate 32 intermediate product terms, and be fed by the digital inputs, comparators, counter/timers and the overcurrent detection signals. The machine feeds all outputs (including gate signals to the high-speed outputs) and the sleep-state circuitry 216. It can also trigger a preload in any of the counter/timers, as described above. The preferred ASM is a Mealy machine, and therefore exhibits the possibility of hazards due to propagation delays through the combinatorial net. To prevent these hazards from appearing at the output of the machine, each output incorporates a resynchronization latch, described below. The resynchronization latches are clocked by the synchronization clock, as described below with reference to FIG. 11. The state machine and its resynchronizers are all reset when the UVLO 31 unlocks. The UVLO, described in detail below, ensures proper operation of the logic circuit 215 over a wide range of supply voltages. The PLA consumes a finite amount of energy for each state transition, so the faster it is run, the greater the average Icc of the part. For this reason, the system clock should be set to as low a frequency as is feasible for the application.

The particular manner by which the digital functional circuit 215 may be programmed is not shown, but may be accomplished by many suitable known techniques in a manner similar to that described above with respect to the programming of the digital configuration logic circuit 217.

For the fastest possible response, an asynchronous digital path is available that bypasses the synchronous logic of the functional digital logic circuit 215, comprising a four-wire bus, HSOUT0–HSOUT3. Each pin of the circuit 120 can be selectively connected to one of these bus lines via an appropriate switch (not shown).

A plurality of configurable counter/timer circuits 214 are provided in connection to the functional digital logic circuit 215 and the configuration digital logic circuit 217. The details of the counter/timer circuits 214 are described below in detail.

A voltage reference circuit 218 is provided to provide a selectable output reference voltage on an output bus 219, including an over current warning on an output line OCD2. The voltage reference circuit 218 also is configurable, in accordance with the signals on bus 223 from the digital configuration logic circuit 217. The details of the voltage reference circuit 218 are described below in detail.

Also, a sleep state circuit 216 can be connected to receive outputs from the counter/timer circuits 214 and the functional digital logic circuit 215, and the buses 212 and 223. The details of the sleep state circuit 216 are described below in detail.

Figure 10:
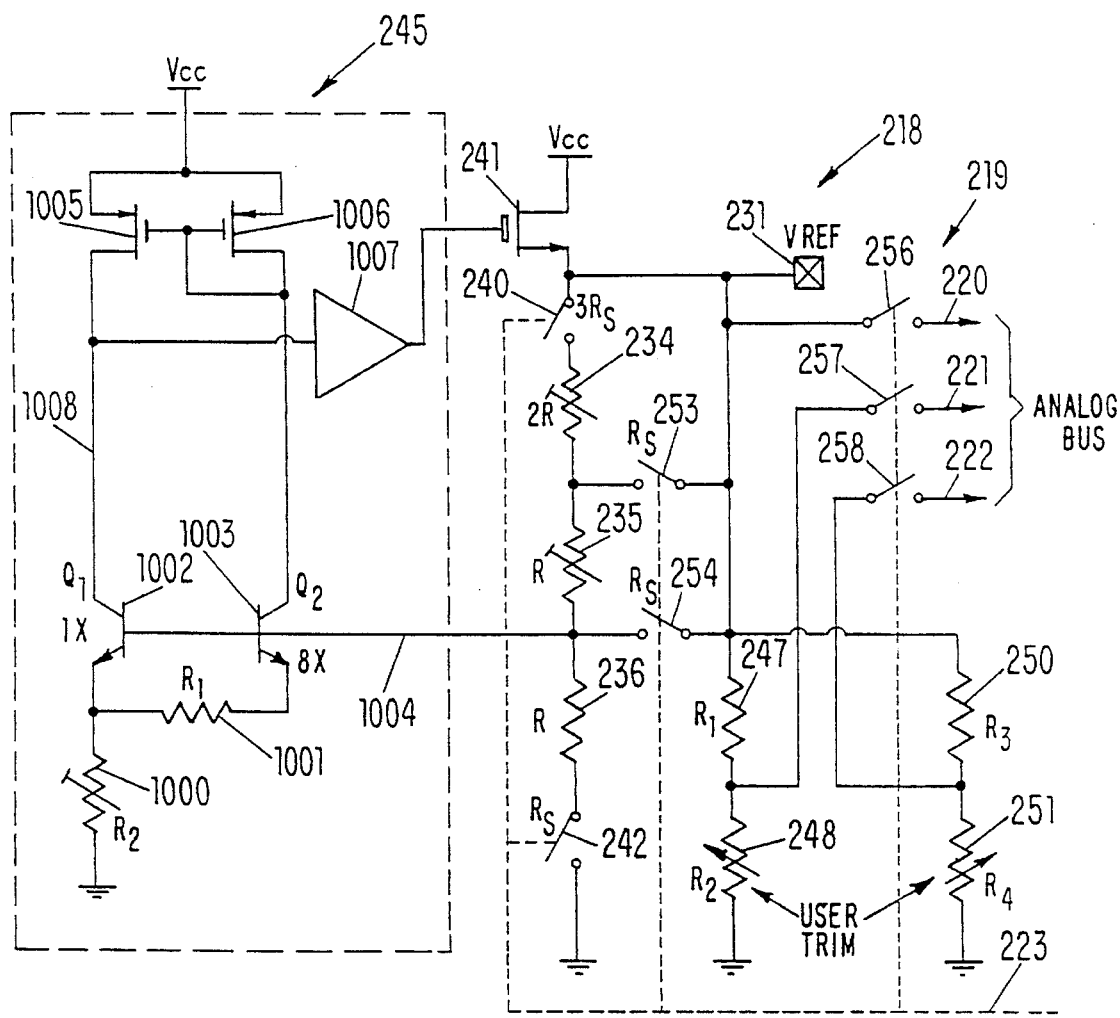
FIG. 10 is an electrical schematic diagram of an analog reference circuit to provide various analog reference voltages for use in the programmable mixed-mode circuit of FIG. 9, in accordance with the invention.

The configurable analog voltage reference circuit 218, the details of which being shown in FIG. 10, provides a selectively available reference voltage, depending upon the state of the switches 240, 242, 253, 254, and 256–258, at least on line 220 which may be a part of the voltage reference output bus 219. The voltage output is also available on a dedicated pin ($V_{REF}$) 231. The pin 231 allows external circuitry to be connected to the internal voltage reference, if desired.

The voltage reference 218 is a series-pass voltage regulator controlled by a Brokaw bandgap circuit 245. The pass device is a MOS transistor 241 connected from the chip supply voltage $V_{CC}$ to a package pin 231. The presence of pin 231 allows the connection of the internally generated reference voltage to circuitry external to the integrated circuit. The Brokaw bandgap circuit 245 adjusts the gate voltage of the pass device 241 to develop a constant voltage on node 1004. This constant voltage will have the lowest temperature coefficient if resistors $R_1$ and $R_2$ are selected so that the voltage is approximately 1.25 volts. By connecting a suitable voltage divider network between the pass device 241 and node 1004, any desired voltage greater than or equal to approximately 1.25 volts can be developed on pin 231.

The Brokaw bandgap circuit 245 has two bipolar NPN transistors 1002 and 1003, two resistors 1000 and 1001, and two MOS transistors 1005 and 1006, as well an amplifier 1007. The transistors 1005 and 1006 are connected to form a current mirror that forces equal currents through the collectors of transistors 1002 and 1003, and therefore approximately equal currents through the emitters of these transistors. Because the emitter area of the transistor 1003 is eight times larger than that of transistor 1002, the current densities within these devices differ by a factor of eight, producing a delta $V_{be}$ voltage of magnitude $V_T \ln(8)$, where $V_T$ is the thermal voltage $$\frac{kT}{q},$$

across the resistor 1001. A current of magnitude $$\frac{V_T \ln(8)}{R_1}$$

flows through $R_1$. Neglecting base current in transistor 1003, a collector current of $$\frac{V_T \ln(8)}{R_1}$$

is developed. This current is mirrored by transistors 1006 and 1005, so that, neglecting base currents, a current of $$\frac{2 V_T \ln(8)}{R_1}$$

flows through the resistor 1000 to ground.

If a voltage of magnitude $$V_{bg} = V_T \left( \frac{R_2}{R_1} \right) \ln(8) + V_{be}(Q_1)$$

is placed on node 1004, this voltage will satisfy the conditions that ensure equal collector currents in transistors 1002 and 1003. If the voltage at node 1004 is raised above $V_{bg}$, the voltage across resistor 1000 will rise, causing a larger current to flow through the transistor 1002 than through the transistor 1003. The difference in currents pulls the voltage of node 1008 lower. This node is connected to the input of voltage amplifier 1007, having a positive voltage gain of $K(s)$. This amplifier therefore pulls the gate voltage of transistor 241 lower, which will reduce current flow through this device. If switch 254 is closed and switches 240, 253, and 242 are open, the voltage at the source of transistor 241 will be imposed on node 1004, and a negative feedback loop will be created. With proper selection of gain function $K(s)$, a stable feedback loop will result that will regulate the voltage on the node 1004 to be equal to $$V_{bg} = V_T \left( \frac{R_2}{R_1} \right) \ln(8) + V_{be}(Q_1).$$

Since $V_T$ has a positive temperature coefficient and $V_{be}(Q_1)$ has a negative temperature coefficient, by proper selection of $R_2$ and $R_1$, an approximately zero temperature coefficient can be produced for the voltage at node 1004. Under these conditions, node 1004 will be at approximately 1.25 volts (if transistors 1002 and 1003 are silicon devices). The resistor $R_2$ can be trimmed by any of a number of schemes known in the art to minimize the residual temperature coefficient of the bandgap cell. Alternative implementations for this bandgap circuit are known in the art.

The voltage reference circuit 218 is provided with a mechanism that allows any of several voltages to be developed at pin 231. If switch 254 is closed and switches 230,253, and 242 are open, then pin 231 develops a voltage $V_{bg}$=1.25 volts. If switches 253 and 242 are closed and switches 240 and 254 are open, then a resistor divider comprising switch resistance $R_s$ of switch 253 and resistor 235 in series with resistor 236 and switch resistance $R_s$ of switch 242. By setting the resistances of resistors 235 and 236 equal and using identical switch designs for switches 253 and 242, a 2:1 voltage divider is placed between pin 231 and node 1004. Thus, a voltage $2V_{bg}$~2.50 volts is developed at pin 231. If switches 240 and 242 are closed and switches 253 and 254 are open, than a 4:1 voltage divider is placed between pin 231 and node 1004. The voltage divider comprises switch resistance $3R_s$ of switch 240, resistors 234 and 235, resistor 236 and the switch resistance $R_s$ of switch 242. If the switches are arranged so that switch 240 has three times the resistance of switch 242 and resistor 234 has twice the resistance of resistors 235 and 236, a 4:1 voltage divider is formed, and a voltage of $4V_{bg}$~5 volts is developed at pin 231. Thus, voltages of 1.25, 2.50, or 5.00 volts may be produced by voltage reference 218, by proper closure of switches 240, 253, 254, and 242. If switch 256 is closed, then the reference voltage present at pin 231 will be connected to line 220 of bus 219, and can therefore be distributed on bus 219 to other analog circuits within the integrated circuit.

The source of the transistor 241 may also be optionally connected to a one or more additional voltage dividers to provide other regulated voltages to selected elements of the circuit 180. In the embodiment shown, for example, two voltage dividers are provided respectively by resistors 247 and 248 and resistors 250 and 251. The junction of the divider resistors 247 and 248 is switchably connected to line 221 of the analog bus 219 by switch 257, and the junction of the divider resistors 250 and 251 is switchably connected to line 222 of the analog bus 219 by switch 258. By setting various ones of the switches 240, 253, 254, and 242, the user can select one of three bandgap reference voltages determined by the ratios of the resistors 240–242 in the resistor ladder, such as 1.25, 2.50 or 5.00 V, to appear on the line 220 and $V_{REF}$ terminal. The values of the resistances of the switches can be scaled in such a way that switch resistance cancels out, as previously discussed, allowing all voltages to be factory-trimmed to provide a high degree of accuracy.

The two resistor dividers formed of resistors 247 and 248 and resistors 250 and 251 can be user-adjusted to generate user-selectable voltages. For example, one resistor divider may be made to be adjustable in 32 steps from 0% to 100% of the selected reference voltage, while the other may be made to be adjustable in 32 steps from 45% to 55% of the selected reference voltage. The various regulated output voltages on lines 220, 221, and 222 allow the user to select a particular bias voltages, including specific user-defined voltages, for instance, to selected ones of the reference voltage terminals $V_{B1}$ or $V_{B2}$ of the input operational amplifier-comparator circuits described above with reference to FIG. 8.

The reference circuit 218 can source a relatively high current. On-board current limiting, not shown in FIG. 10, may be provided to protect the reference circuit 218 from short-circuit damage, and if the current limit is triggered, a signal can be generated for the digital logic circuit 215 on line OCD2 219, (see FIG. 9). By this means, the user can program the part to take a specific action in the event of an overcurrent condition.

The various switches 240, 242, 253, 254, 256, 257, and 258 are controlled by the states on the configuration bus 223 from the digital configuration logic circuit 217. Additionally, the particular trim of resistors 248 and 251 can also be configured by the states on the configuration bus 223 from the digital configuration logic circuit 217. Thus, the specific configuration of the analog voltage reference circuit 218 and the particular voltages provided on output voltage bus 219 can be selected or established by the particular programming states in the digital configuration logic circuit 217.

Figure 17:
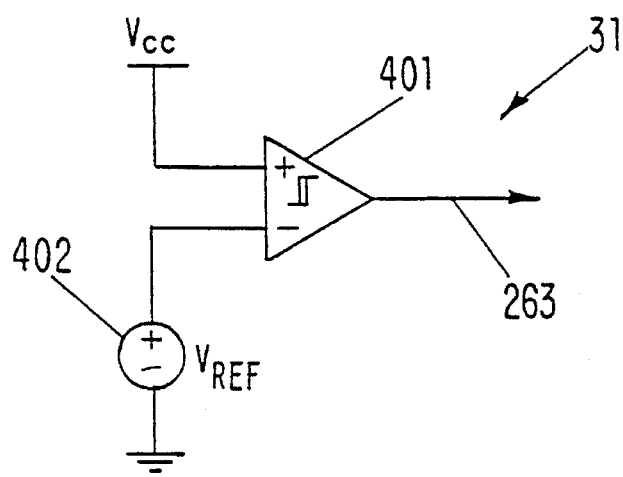
FIG. 17 is an electrical schematic diagram of a under voltage lock out (UVLO) circuit for use with the programmable mixed-mode circuit of FIG. 9, in accordance with the invention.

To insure proper operation of the circuit 180 in the event that the supply voltage falls below an acceptable level, an undervoltage lockout (UVLO) module 31 (See FIG. 17) is provided, so that undefined output states are avoided when the supply voltage is too low to support operation of the logic circuitry. Details of a UVLO circuit 31 that can be used are shown in FIG. 17. The UVLO circuit 31 has a comparator 401 with hysteresis of a desired value. The value of the particular hysteresis may be programmably defined, if desired, but some degree of hysteresis is desirable to prevent chattering of the turn-off and turn-on of the circuit due to the capacitive and loading effects on the supply voltage. A voltage reference 402 provides a voltage reference against which the supply voltage $V_{CC}$ is compared, to cause the state on the output line 263 to change when the supply voltage falls below the reference. The output state on line 263 can be used, for example, to enable or to reset the remaining circuits on the chip, or when the UVLO circuit 31 is engaged, the internal circuitry of the circuit 180 may be shut down with all digital outputs forced to assume specific low-supply states. For example, the trip voltages of the UVLO 31 can be made to be dependent upon which bandgap reference voltage is chosen:

| | $V_{REF}$ | $V_L$ | $V_H$ | Hysteresis |
|---|---|---|---|---|
| Option One | 1.25V | 2.00V | 2.25V | 0.25V |
| Option Two | 2.50 | 3.00 | 3.50 | 0.50 |
| Option Three | 5.00 | 6.00 | 7.00 | 1.0 |

When the supply voltage first rises above $V_H$, the UVLO module 31 can be set to generate a reset pulse to clear all digital storage elements within the circuit 180. The UVLO circuit 31 will engage again when the supply voltage falls below $V_L$, locking all outputs off and restoring the part to the initial power-on state. Thus, the power supply operating voltage range over which the digital parts of the circuit properly function can be greatly extended from previous circuits having no such on-board voltage referencing, detection, and protection.

Figure 11:
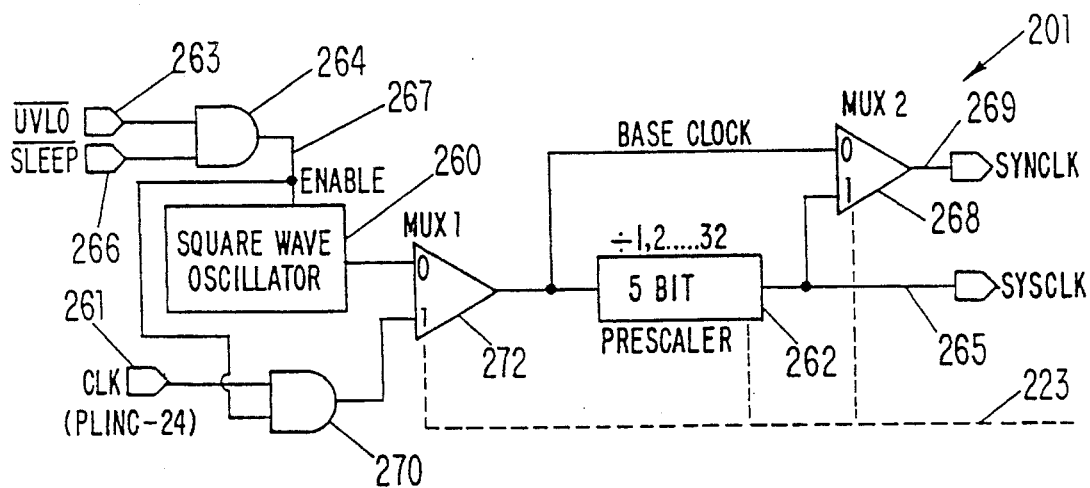
FIG. 11 is an electrical schematic diagram of a clock circuit that can provide system clock and synchronization clock pulses, for use in the programmable mixed-mode circuit of FIG. 9, in accordance with the invention.

The configurable system clock 201 provides the master timing and synchronization source for the programmable mixed-mode circuit 180 of the invention, and is shown in block diagram form in FIG. 11. The base clock from which the other clock signals are derived may be generated by an on-board oscillator 260. The oscillator 260 is a free-running square-wave generator that produces, for instance, a nominal 10.0 MHz square wave with a 50% duty cycle. In the embodiment shown, however, the clock can alternatively be provided from an external source (not shown) on an external clock pin 261. The external clock can be used, for example, to synchronize the circuit 180 of the invention to an external digital system, or it can be used to single-step the part for diagnostic purposes.

The oscillator 260 is enabled from the output of an AND gate 264 on line 267, representing the AND conjunction of the active low signals from the undervoltage lockout (UVLO) module 31 and sleep state circuit 216, respectively applied on input lines 263 and 266. Thus, if an undervoltage condition occurs, or the circuit 180 is in a sleep state, determined by the sleep state circuit 216, the oscillator 260 is disabled, thus reducing supply current requirements.

The output from the AND gate 264 is also applied to an input of an AND gate 270, to enable the external clock signal from terminal 261 applied to the other input terminal. The output from the AND gate 270 is applied to one input of a multiplexer circuit 272, and the output from the oscillator 260 is applied to the other. Thus, the multiplexer 272 can select the base source of clock pulses to be from either the on-board oscillator 260 or the external clock source on terminal 261, when these circuits are enabled by the state of the signal on the line 267.

The base clock frequency is divided by a configurable prescaler circuit 262 to provide the system clock on line 265 which can be used, for example, to drive the associated digital logic circuit 215. The prescaler value of the circuit 262 can be set to divide the input clock frequency by any factor, for instance, from 1 to 32. Thus, system clock frequencies as high as 10.0 MHz or as low as 312.5 KHz can easily be obtained from the on-board oscillator 260 having a base frequency of 10.0 MHz.

A second multiplexer 268 is also connected to receive the system clock on line 265 on one input, and a base clock frequency before prescaling on the other input, to provide a selectable synchronization clock signal on output line 269. The synchronization clock can be used to feed the synchronizing latches in the output circuits. If the multiplexer 268 is configured to connect the synchronization clock output line 269 to the system clock line 265, then all outputs lag internal states by one system clock period. On the other hand, if the multiplexer 268 is configured to connect the synchronization clock to the base clock, then outputs exhibit a minimal amount of lag behind the system clock.

The configurable system clock 201 receives configuration signals from the configuration logic circuit 217 to select the states of the various configurable parts, for instance, the multiplexers 272 and 268, and the prescaler circuit 262, by signals on the configuration bus 223. Thus, the user can easily configure the system clock 201 to perform any of its possible selectable functions merely by appropriately programing the configuration logic circuit 217.

Figure 12:
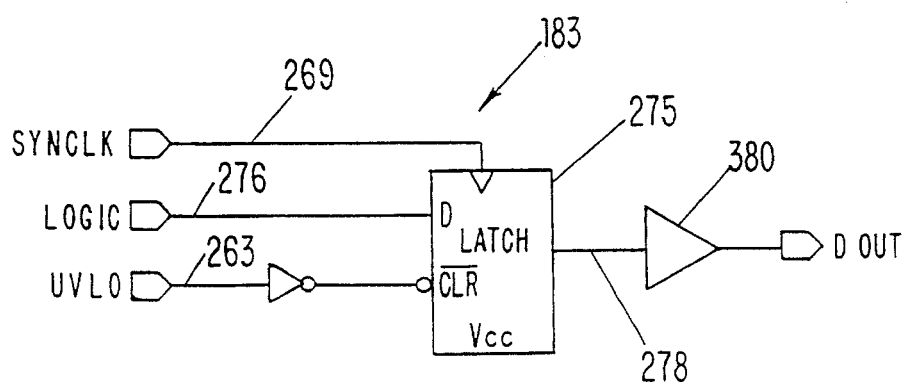
FIG. 12 is an electrical schematic diagram of a digital output circuit that can provide digital output signals from the programmable mixed-mode circuit of FIG. 9, in accordance with the invention.

As mentioned, each I/O pin also has an output driver of various construction associated with it. With reference now to FIG. 12, the details of a basic digital output circuit 183 are shown. The various other digital output circuits, of course, can be similarly constructed. The digital output circuit 183 is connected to a supply voltage, $V_{CC}$.

A latch 275 receives digital input data on input line 276, provided the UVLO signal on line 263 is low. The synchronization clock signal on line 269 is applied to synchronously clock the data through the latch 275, as above mentioned. The clocked latch 275 is used to resynchronize the output of combinatorial logic in the digital functional logic circuit 215, preventing transient states from appearing at the output.

If desired, any general-purpose digital pin driver 380 can be programmed to limit slew rates, reducing EMI/RFI. Although these output drivers are normally rail-to-rail, a variety of other operational modes can be selected. These include open-drain-sink, open-drain-source, open-drain-sink with pull-up, or open-drain-source with pull-down. Pull-up and pull-down currents can be selected, for instance, to be either 100 µA or 1.0 mA, if desired, using a bidirectional digital signal conditioning circuit, such as the circuit described below with reference to FIG. 16.

Figure 16:
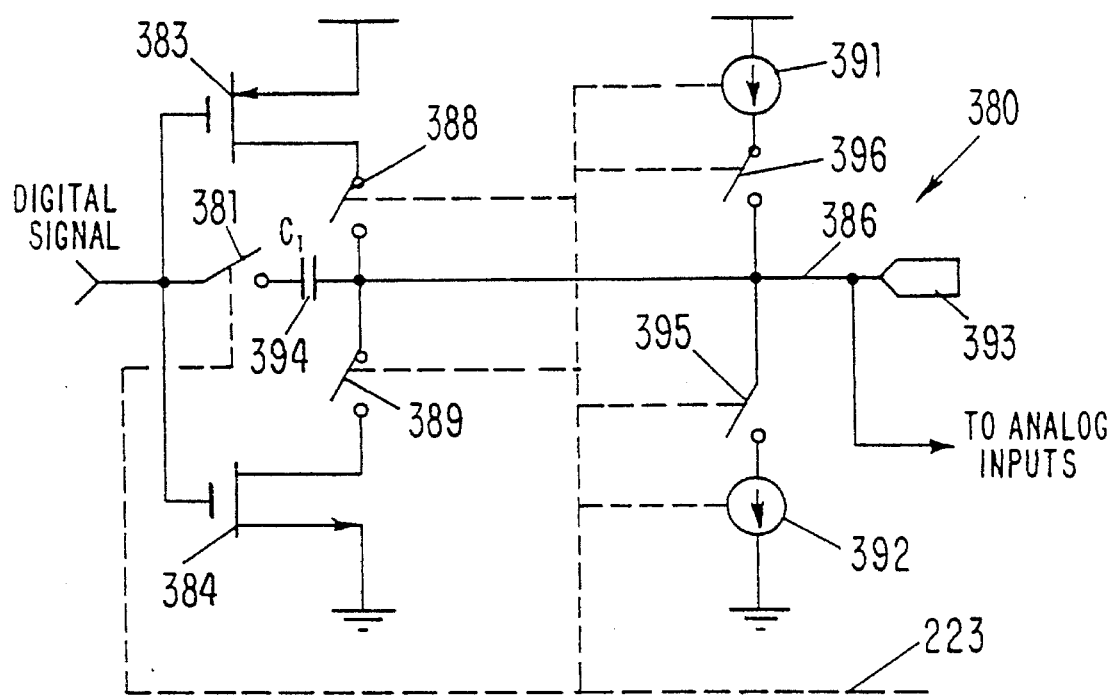
FIG. 16 is an electrical schematic diagram of a bidirectional digital signal conditioning circuit for use with the programmable mixed-mode circuit of FIG. 9, in accordance with the invention.

The details of a digital pin driver 380 are shown in FIG. 16. The pin driver 380 is suitable for constructing a digital output circuit 183. The digital output comprises an inverter containing suitably sized complementary MOS transistors 383 and 384. If switches 388 and 389 are both closed, this driver is a CMOS rail-to-rail output driver. If switch 388 is closed, but switch 389 is open, the circuit becomes a PMOS open-drain output. If switch 389 is closed, but switch 388 is open, the circuit becomes an NMOS open-drain output. If both switches 388 and 389 are open, the output driver is tri-stated, allowing the associated output pin 393 to be used as an input pin to an analog input module 120, 120' or 120". If an output configuration is chosen, either or both switches 388, 389 are closed, then slew-rate limiting can be inserted by closing switch 381, placing slew-rate limiting capacitor 394 across the output driver.

If a pull-up or pull-down current is desired, current sources 391 and 392 can be utilized for this purpose. A pull-up current source might be desired, for example, to create an open-drain driver which can be externally wired-OR/d. Current source 391 can be programmed to deliver either 100 µA or 1 mA, and if switch 396 is closed, this current source can be used as a pull-up current source 392 can be programmed to deliver either 100 µA or 1 mA, and, if switch 395 is closed, this current source can be used as a pull-down.

The digital configuration logic 217 controls which features of the pin driver 380 are utilized by means of signals imposed on bus 223. Bus 223 determines whether switches 381, 388, 395, and 396 are open or closed and also what value of current is sourced by current source 391 or is sunk by current source 392.

In addition to these features, each digital output circuit has a defined low-supply state that is determined by the UVLO circuit 31, described above. Each output can be programmed to either assume a high-impedance state, or to pull low. Each pair of digital outputs (such as A2/A3) are protected by a cross-connected transient suppresser (shown connected across the input terminals of the High Speed comparator circuits 208 and 209). This surge supresser (which may be a bidirectional avalanche breakdown structure, such as back-to-back Zener diodes, or the like) allows the pair of outputs to directly drive a piezo element, if desired, without requiring external protection elements.

Figure 13:
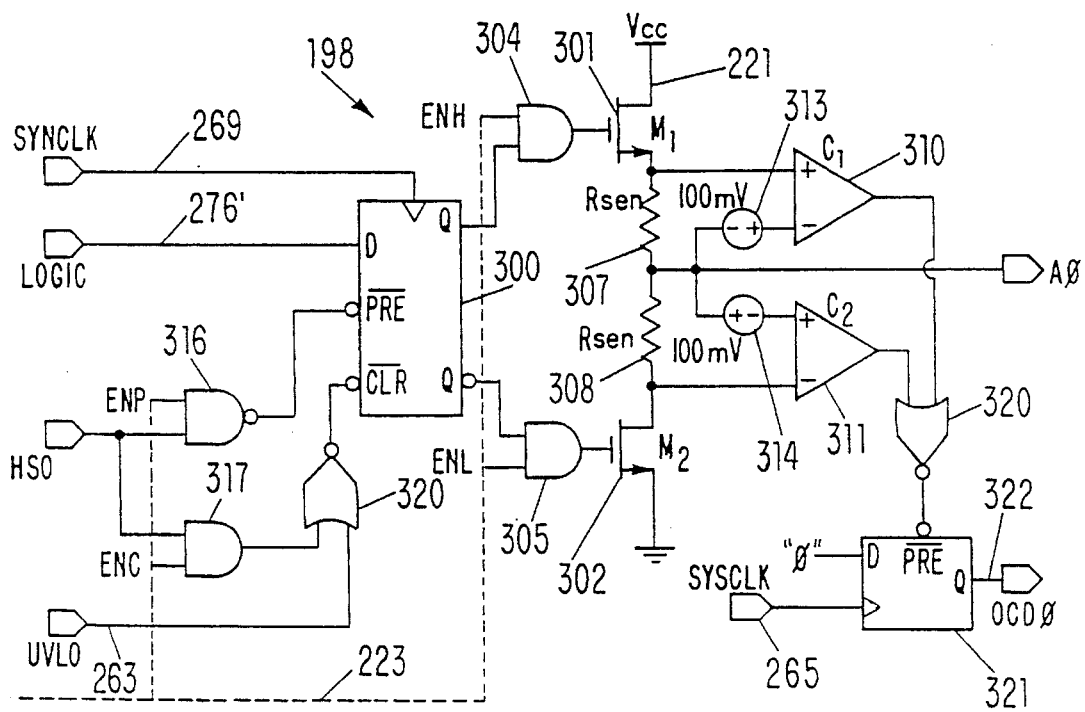
FIG. 13 is an electrical schematic diagram of a power driver output circuit that can provide output signals from the programmable mixed-mode circuit of FIG. 9, in accordance with the invention.

In the embodiment shown, two of the general-purpose I/O pins (A0 and A1) are configured as power drivers. The basic circuit of a power driver, such as driver 198 of FIG. 9, is shown in FIG. 13. The other power drivers, of course, can be similarly constructed. The power driver 198 is connected to a supply voltage, $V_{CC}$, and includes a latch 300 that receives the digital data input on line 276' and the synchronizing clock on line 269, to resynchronize the signal generated by the digital logic circuit 215. On the other hand, the power driver 198 can be asynchronously preset or cleared by a high-speed asynchronous data line HS0, should this be desired. This feature allows the implementation of high-speed shutdowns, current-mode controllers, and similar systems which require high-speed asynchronous response.

The signal on high speed line HS0 is connected to one input of a NAND gate 316 and one input of an AND gate 317. Enable lines, below described ENP and ENC are connected respectively to the other input lines of the NAND gate 316 and AND gate 317. If ENP is set, then HS0 will asynchronously set the output. If ENC is set, then HS0 will asynchronously clear the output. The output of the NAND gate 316 is inverted and connected to the preset input $\overline{PRE}$ of the latch 300. On the other hand, the under voltage signal UVLO on line 263 is connected to one input of a NOR gate 320, the output of which is connected to the clear terminal $\overline{CLR}$ of the latch 300. This connection ensures that the output is always cleared upon startup. The output of the AND gate 317 is connected to the other input of the NOR gate 320.

The output of the latch is used to drive a totem pole output that includes NMOS transistors 301 and 302, the gates of which are connected respectively to the Q and $\overline{Q}$ outputs of the latch 300, via AND gates 304 and 305. Additional enable signals ENH and ENL are connected to respective inputs of AND gates 304 and 305. If ENH is set, the output functions as a high-side driver. If ENL is set, the output functions as a low-side driver. If both are set the output acts as a totem pole driver.

The totem pole output circuit includes a pair of resistors 307 and 308 connected in series between the source of the transistor 301 and the drain of the transistor 302, the junction 309 therebetween being connected to the output terminal A0. Each side of the resistors 307 and 308 has a respectively associated overcurrent detection comparator 310 and 311 to drive a capture latch 321 that ensures that transient overcurrent events will be detected. The pair of comparators 310 and 311 are connected, with the non-inverting input of comparator 310 connected to the source of transistor 301, and the inverting input of comparator 311 connected to the drain of the transistor 302. The inverting input of the comparator 310 is biased by voltage source 313 referenced to the junction 309, and the non-inverting input of comparator 311 is biased by voltage source 314 also referenced to the junction 309.

The outputs of the comparators 310 and 311 are connected to respective inputs of a NOR gate 320, the output of which is inverted and applied to the preset input $\overline{PRE}$ of a second latch 321. The data input of the latch 321 is connected to a logic low state, and the system clock on line 265 is connected to normally clock the "0" input state onto the line OCD0 in the absence of an overvoltage condition. When an overcurrent condition occurs, it is latched onto line 322, so that transient overcurrent conditions can be detected. The overcurrent output OCD0 is fed on line 322 to the digital logic circuit 215 so that various protection schemes can be implemented, if desired.

The power driver circuit 198 can be used to implement a pulse-width modulation (PWM) power limiting scheme, as may be needed for driving, for instance, incandescent lamps. Alternately, the circuitry could be used to implement fault detection and some form of shutdown. Or, depending upon which of enable lines ENH or ENL are set, the power driver circuit 198 can be set to provide motor driving signals in one of three basic modes: High-Side Driver (HSD), Low-Side Driver (LSD), or Half-H (which incorporated both high-side and low-side drive). The HSD and LSD options can be optimized, if desired, for incandescent lamp and signal relay driver applications. The half-H mode is designed to drive external MOSFETs. No provision is made for slew-rate control of power drivers. Active pull-downs or pull-ups of either 100 µA or 1.0 mA are available, although not explicitly shown in FIG. 13. These may be useful for detecting open loads or shorted loads. As with all other outputs, a low-supply output state can be defined (either high-impedance or open-drain pull-down); again, this circuitry is not explicitly shown in FIG. 13.

The particular function desired for the power driver circuit 198 may be selected by the user by programming the configuration logic circuit 217 to present the appropriate states on the configuration bus 223 to the inputs to the gates 316, 317, 304, and 305, as above described.

Figure 14:
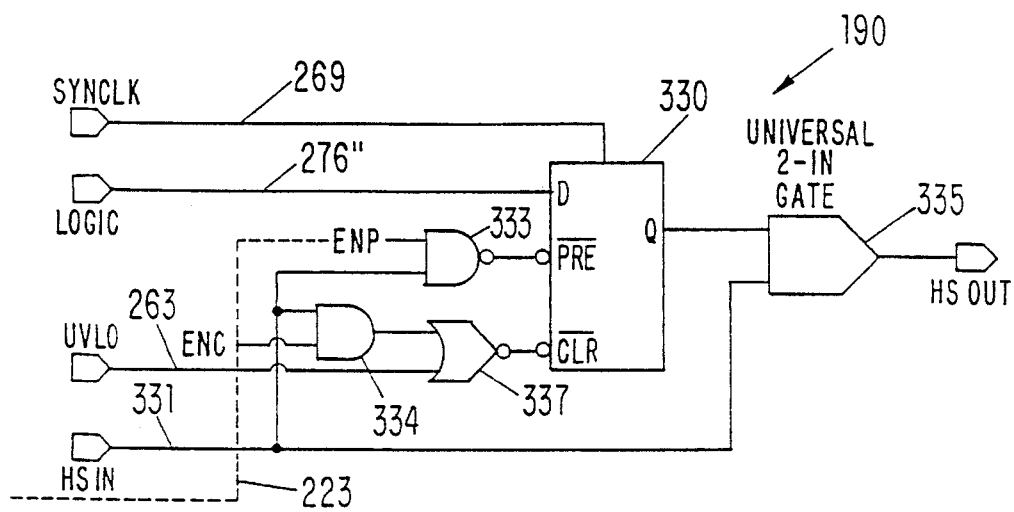
FIG. 14 is an electrical schematic diagram of a high speed driver circuit that can provide high speed output signals from the programmable mixed-mode circuit of FIG. 9, in accordance with the invention.

The embodiment the circuit 180 shown in FIG. 9 contains four dedicated high-speed output drivers 190–193 (labeled "FAST") to respective I/O pins B0–B3. One driver 190 is shown in FIG. 14, the other drivers being similarly constructed. The driver circuit 190 has a latch 330 that is clocked by the system clock on line 269, and receives digital data input on line 276". Signals on the high speed line input HSIN 331 are connected to one input terminal of a NAND gate 333, and AND gate 334, and to one input terminal of a universal two-input digital logic gate 335. ENP and ENC enable signals derived, for example, from the configuration logic circuit 217 on configuration bus 223, are respectively connected to the other inputs of the NAND gate 333 and AND gate 334. If ENP is set, then the HSIN line will asynchronously set the output latch. If ENC is set, then the HSIN line will asynchronously clear the output latch. The inverted output of the NAND gate 333 is connected to the preset input $\overline{PRE}$ terminal of the latch 330, and the output of the AND gate 334 is connected via NOR gate 337, after being inverted to the clear input $\overline{CLR}$ of the latch 330. The undervoltage signal on line 263 is connected to the other input of the NOR gate 337. This connection ensures the output is always cleared upon startup.

The output from the driver 190 is gated by the universal two-input digital logic gate 335 to perform any logic function of one or two inputs, the HSIN signal being fed directly to the output without passing through the resynchronization latch 330. Thus, one input of the gate 335 is the high-speed asynchronous line 331, while the other is a resynchronized output of the synchronous digital circuit. As with all of the power drivers, the high-speed asynchronous data line 331 can also be used to preset or clear the resynchronizer, as shown. The only driver configuration available for these outputs is rail-to-rail CMOS, without slew-rate limiting or pull-up or pull-down currents. As with other output driver configurations, a low-supply output state (either high-impedance or active-low) can be user defined, although this circuitry is not explicitly shown in FIG. 14.

The circuit 180 of FIG. 9 contains two specialized high speed comparators 208, connected between A2 and A3, and 209, connected between B2 and B3. The comparators 208 and 209 are optimized for high-speed operation. These comparators are faster than the general-purpose operational amplifier-comparator circuits. These comparators can be used for high-speed shutdown paths to power drivers, for implementing current-mode controllers, or as general-purpose fast comparators.

Figure 15:
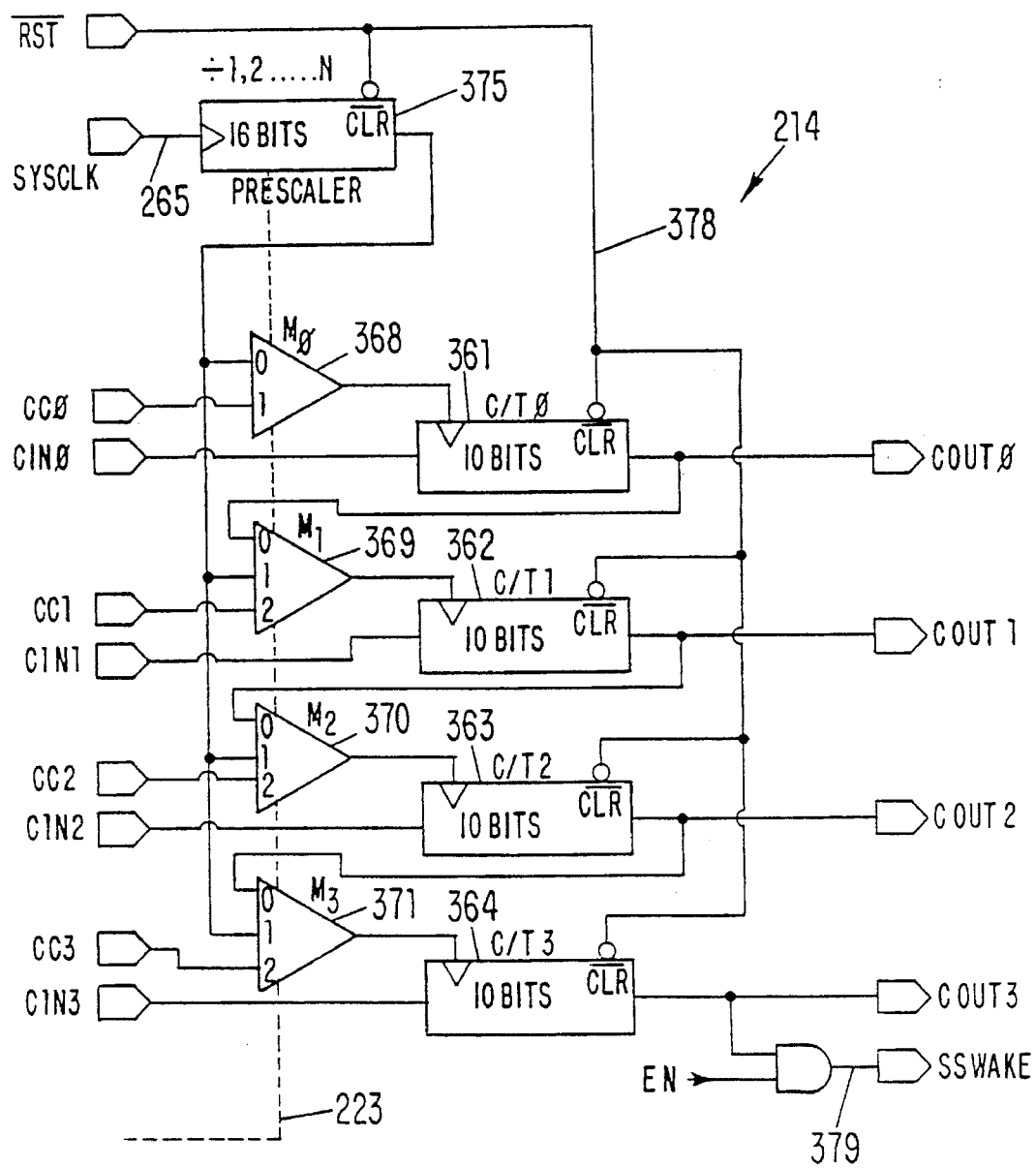
FIG. 15 is an electrical schematic diagram of a flexible counter circuit that can provide counting and timing for use with the programmable mixed-mode circuit of FIG. 9, in accordance with the invention.

In the embodiment of the circuit 180 shown in FIG. 9, a bank of configurable timer/counters 214 is included, as shown in the block diagram of FIG. 15. In the embodiment shown, there are four timer/counters 361–364, although any number can be employed, as desired. The four counter/timers 361–364 can be flexibly configurable to accomplish various counting and/or timing functions on their output lines COUT0–COUT3. Each of the counter/timers 361–364 and a configurable prescaler circuit 375 are connected to receive a reset signal on line 378, which comes from the UVLO circuit 31, to clear or initialize their contents. The clock inputs of each counter/timer 361–364 receives the output of a respective multiplexer 368–371, which may be configured by signals on the configuration bus 223 from the configuration logic circuit 217 to enable clock selection to be made from various combinations of clock signals.

The system clock derived on system clock line 265 is applied to clock the prescaler circuit 375, to allow a divisor between 1 and N to be selected by which the system clock frequency can be divided. The output from the prescaler 375 is connected to inputs of each of the multiplexers 368–371 so that it can be applied via one or all of them to their respective counter/timer 361–364. Likewise, discrete input terminals CC0–CC3 are connected to inputs of respective ones of the multiplexers 368–371 so that the counter/timers 361–364 can selectively receive one or all of the signals applied to these input lines, which are driven by digital logic 215. Finally, the output from each counter/timer, except the first counter/timer 361, is applied to the multiplexer of the next, so that by selection by the multiplexers 368–371 all or selected ones of the counter/timers 361–364 can be connected together to increase the length of the counter/timer, if desired. Additional input lines CIN0–CIN3 are connected to the counter/timers 361–364 so that particular values can be preloaded into the respective counter/timers from the digital logic 215, as desired.

Thus, each counter/timer can be used as an independent building block, or they all can be ganged together, in whole or in part, to form larger sections by means of their selectively interconnectable inputs and outputs. The outputs of the counter/timers are available to the digital logic circuit 215, and the output of the last counter/timer 364 is also available as a possible wakeup signal on line 379 to the sleep-state circuit 216.

The counter/timers can be run from one of two clock sources: the system clock (timer mode), or from an output of the digital logic circuit 215 (counter mode). If the system clock is selected, the sixteen-bit prescaler 375 is available to scale the clock to lower frequencies. The single prescaler 375 is shared by all four counter/timers. Assuming the minimum system clock frequency is chosen, and the maximum prescaler term is used, a single ten-bit counter/timer can produce time intervals up to 200 µs in length, if the oscillator frequency is 10 MHz. At programming time, each counter/timer can be set to either be a one-shot (count down and stop) or a free-running timer (cyclically count down). Any counter/timer can be preloaded by a signal from the digital programmable logic, whereupon it will begin counting down from its preset value (this feature starts a one-shot, or resynchronizes a free-running counter/timer).

All counter/timers are set to definite states by the UVLO 31. One of two alternate states can be chosen: the rest state (zero state) or the preload state. A one-shot initialized to its rest state will generate no output pulses until after it has been deliberately preloaded. Thus, by initializing one-shots to their rest states, the designer can ensure that no spurious pulses will be generated upon startup.

The programmable mixed-mode circuit 180 of the invention incorporates two power management features for low-current operation. First, any section of circuitry that is not programmed can be automatically be disabled by the digital configuration logic 217, and the $I_{CC}$ consumption will thus be reduced. Also, the input operational amplifier-comparator circuits, high-speed comparators and PLA product terms can all be selectively shut down individually should they not be required for a given application. Second, the circuit 180 incorporates a sleep-state circuit 216. The sleep-state circuit 216 can be activated by an output of the functional logic circuit 215. When activated, the entire circuit 180 goes into a dormant sleep state, where the reference, operational amplifier-comparator circuits, high-speed comparators and functional logic circuit 215 are disabled. Pull-up and pull-down currents can be deactivated, and all outputs configured to assume their low-supply states. The state latches and resynchronizer latches hold the last state of the system, so that upon awakening the system can check the state just prior to shutdown. The circuit 180 remains in the sleep state until a wake-up signal is received. This signal will normally be generated by one of the four high-speed lines HS0–HS3, driven by the Schmidt trigger associated with one of the inputs, since this circuitry is static, and thus remains alive even in sleep state. Alternatively, the count from the counter/timer 364 can be used, allowing a periodic wake-up signal to be generated. The user can also choose to OR several different wake-up signals together to provide for multiple possible wake-up conditions. It should be noted that if the output from the counter/timer 364 is used to generate a wake-up signal, then the system clock must remain running. If the internal oscillator is used, this will require current. On the other hand, if the output from the counter timer 364 is not used, the system clock is disabled, eliminating the oscillator current.

The programmable mixed-mode circuit 180 of the invention is a field-programmable device. Programming can be performed using a standard EPROM programmer and a suitable personality module. During programming mode, the functionality of ports $A_x$, $B_x$, and $C_x$ are altered, as is shown in the following table:

| Run Mode | Program Mode |
|----------|--------------|
| A0 | D0 |
| A1 | D1 |
| A2 | D2 |
| A3 | D3 |
| B0 | D4 |
| B1 | D5 |
| B2 | D6 |
| B3 | D7 |
| C0 | SCLK |
| C1 | SIN |
| C2 | R/W |
| C3 | PGM |

The programmable mixed-mode circuit 180 of the invention has its program memory arranged in bytes. Each programming cycle will thus access eight memory locations (bits) in parallel. However, unlike digital memories and microprocessors, the circuit 180 does not rely upon address decoding to address individual bytes, but instead relies upon a serial shift register technique. In order to address a particular byte of memory, a single logic "1" is propagated through the shift register until it aligns with the desired byte. To ensure that only one logic one is in the shift register, it must be flushed and preloaded before attempting to access program memory.

The digital logic circuity can be divided into sections, if desired. One section may be programmed during manufacture, and may contain, for example, trim bits, such as for the bandgap and similar manufacture trim settings. A second part of the digital logic circuitry may be user programmable to provide the configuration logic to control the topology and parameterization of the circuit 180. A third part may be used to contain the functional logic, in the form, for example, of a state machine, or the like, and the forth part may contain the algorithms and logic to program the other parts of the logic circuitry.

With a circuit constructed as described above, a user can program the programmable mixed-mode circuit 180 of the invention units using a standard EPROM programmer. For small runs, the most economical solution is a gang programmer that will program a number of units in parallel. For large production runs, a more economical solution may be to allow the manufacturer to program the units using the proper configuration information.

The programmable mixed-mode circuit 180 differs from most analog integrated circuits in that it can be programmed before it is installed in an application. The programming process is an integral part of designing the circuit 180 into a user application. The user initially designs and simulates the circuit 180 using a set of integrated software tools that run, for example, on a personal computer. These tools may include an editor, simulator, programmer and debugger, which function as below described.

The first step in configuring the programmable mixed-mode circuit 180 is to choose the desired pin functionality. The editor can be constructed to allow the user to select input and output modules that correspond to various pins. Because not all of the functions can be accessed from all of the pins, the editor can determine the restrictions that may exist on any particular choice of pin numbers to insure that only those which can implement the desired set of input and output functions are used. If desired, the editor can also display a list of parameters associated with each module when that module is selected. For example, when a digital input is specified, the user may select a pull-up or pull-down current from an allowed list of currents, such as 0, 100 μA, or 1 mA. The editor can then check to make sure that the programmable mixed-mode circuit 180 can actually implement the desired function, so it is impossible to enter a configuration that cannot be generated by the hardware of the circuit 180.

The next step in programming is to choose the desired digital functionality. Digital functions include functions provided by the timers, counters, latches and combinatorial logic. Although the editor might be constructed to allow the user to enter state equations into the editor, a simple graphical interface may be easily provided to simplify the task of entering state diagrams.

The final process of programming sets programmable memory elements inside the circuit 180 to store the desired configuration. One way in which the circuit 180 may be programmed is through the use of a personality module attached to a standard EPROM programmer, and downloading the configuration data generated by the editor into the circuit 180. The result is a functioning circuit that is ready for installation in the application. In a preferred embodiment, the program memory of the circuit 180 is not erasable, but the is incrementally programmable so that a trim value can be loaded into the circuit after it has been evaluated in an application.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A programmable device fabricated on a single semiconductor chip, comprising: a circuit having programmable distal logic states;
   at least one configurable analog circuit having an input and an output;
   and circuitry for selectively configuring the at least one analog circuit in accordance with the programmable digital logic states and, wherein said circuit has said programmable digital logic states being user programmable, wherein said programmable device further comprises circuitry connected to said circuit having programmable digital logic states to preset the digital logic states into a known state on power-up.

2. The programmable device of claim 1, wherein said circuitry to preset the digital logic states into a known state on power-up comprises an undervoltage lock out circuit.

3. The programmable device of claim 1, wherein said at least one configurable analog circuit comprises configurable circuitry for controlling interconnectivity of said at least one analog circuit.

4. The programmable device of claim 1, wherein the at least one analog circuit comprises at least one operational amplifier.

5. The programmable device of claim 1, wherein the at least one analog circuit comprises at least one voltage comparator circuit.

6. The programmable device of claim 1, wherein the at least one analog circuit comprises a circuit that is selectively configurable either as an operational amplifier or a comparator in dependence upon the programmable digital logic states.

7. The programmable device of claim 3, wherein the configurable circuitry for controlling interconnectivity comprises switches controlled by said digital logic states.

8. The programmable device of claim 7, wherein each of said switches is comprised of a network of switches.

9. The programmable device of claim 8, wherein at least one of said switches is connected to selectively connect at least one input/output pin to an input of said at least one analog circuit.

10. The programmable device of claim 3, wherein the configurable circuitry for controlling interconnectivity comprises programmable elements that are reprogrammable.

11. The programmable device of claim 7, wherein said programmable device further comprises a plurality of input/output pins, wherein said at least one configurable analog circuit comprises a plurality of configurable analog circuits.

12. The programmable device of claim 11, wherein said digital logic states control said switches to interconnect said analog circuits to selected input/output pins.

13. The programmable device of claim 11, wherein said digital logic states control at least some of said switches to connect outputs of said configurable analog circuits to inputs of the digital programmable logic without passing through any of said input/output pins.

14. The programmable device of claim 11, wherein said digital logic states control at least some of said switches to connect digital signals from the circuit having programmable digital logic states to inputs of at least some of said configurable analog circuits without passing through any of said input/output pins.

15. The programmable device of claim 12, wherein said programmable device further comprises a digital functional logic circuit to process digital data within said programmable device.

16. The programmable device of claim 15, wherein said digital functional logic circuit is programmed to be responsive to data within said programmable device.

17. The programmable device of claim 15, wherein said digital functional logic circuit is user programmable.

18. The programmable device of claim 15, wherein said digital functional logic circuit is configurable, and is connected to said circuit having said digital logic states.

19. The programmable device of claim 15, wherein said digital functional logic circuit is connected to said circuit having said digital logic states.

20. The programmable device of claim 15, wherein the circuit having programmable digital logic states comprises a PLA.

21. The programmable device of claim 15, wherein the circuit having programmable digital logic states comprises an FPLA.

22. The programmable device of claim 15, wherein the circuit having programmable digital logic states comprises a PLD.

23. The programmable device of claim 15, wherein the circuit having programmable digital logic states comprises a PGA.

24. The programmable device of claim 15, wherein the circuit having programmable digital logic states comprises an FPGA.

25. The programmable device of claim 15, wherein said programmable device further comprises a plurality of binary counters arranged to perform counting, timing, and sequencing functions, and which are configured by said circuit having said programmable digital logic states and supply signals to said digital functional logic circuit.

26. A programmable device fabricated on a single semiconductor chip, comprising: a circuit having programmable digital logic states;
   at least one configurable analog circuit having an input and an output;
   and circuitry for selectively configuring the at least one analog circuit in accordance with the programmable digital logic states, and
   wherein said at least one configurable analog circuit comprises configurable circuitry for controlling interconnectivity of said at least one analog circuit, and
   wherein the configurable circuitry for controlling interconnectivity comprises one-time programmable elements.

27. A programmable device fabricated on a single semiconductor chip, comprising: a circuit having programmable digital logic states;

at least one configurable analog circuit having an input and an output;

and circuitry for selectively configuring the at least one analog circuit in accordance with the programmable digital logic states, and wherein said circuit has said programmable digital logic states being user programmable, and wherein said at least one configurable analog circuit comprises configurable circuitry for controlling interconnectivity of said at least one analog circuit and wherein the configurable circuitry for controlling interconnectivity comprises switches controlled by said digital logic states, and wherein at least one of said switches are connected to selectively route digital data into and out of the circuit having programmable digital logic states to bypass said at least one configurable analog circuit.

28. A programmable device fabricated on a single semiconductor chip, comprising: a circuit having programmable digital logic states;

at least one configurable analog circuit having an input and an output;

and circuitry for selectively configuring the at least one analog circuit in accordance with the programmable digital logic states, and wherein said at least one configurable analog circuit comprises configurable circuitry for controlling interconnectivity of said at least one analog circuit, and wherein the configurable circuitry for controlling interconnectivity comprises switches controlled by said digital logic states, and wherein said at least one configurable analog circuit comprises a plurality of configurable analog circuits, and, wherein at least one of said plurality of analog circuits are formed in an input/output module, said input/output module comprising a plurality of circuits that are each selectively configurable either as an operational amplifier or a comparator.

29. The programmable device of claim 28, wherein the plurality of analog circuits are interconnected by analog signal paths whose interconnectivity is determined by the programmable digital logic states.

30. The programmable device of claim 28, wherein at least one of said signal paths interconnect outputs of at least one of said analog circuits to inputs of at least one of said analog circuits entirely on chip.

31. The programmable device of claim 28, wherein each module comprises four analog circuits that are each selectively configurable either as an operational amplifier or a comparator, and wherein said four analog circuits are connected to four input/output pins through a plurality of switches.

32. The programmable device of claim 31, wherein said plurality of switches are arranged to enable said input/output pins to be connected to at least one input of at least one of said analog circuits and at least one output of one of said analog circuits.

33. The programmable device of claim 32, wherein said programmable device further comprising a plurality of bypass lines and a corresponding plurality of switches in series with said bypass lines to selectively bypass at least one of said four circuits.

34. A programmable device fabricated on a single semiconductor chip, comprising:

a circuit having programmable digital logic states;

a plurality of input/output pins;

a plurality of analog circuits, each having an analog input and an analog output;

a plurality of configurable interconnectivity controlling circuits to enable one of said input/output pins selectively connected to one of at least two of said analog circuits;

and said circuit having programmable digital logic states being connected to said plurality of interconnectivity controlling circuits to connect a selected one of said input/output pins to a selected one of said one analog circuits in accordance with the programmable digital logic states, and wherein said circuit has said programmable digital logic states being user programmable, wherein said circuit has said programmable digital logic states being user programmable further comprising circuitry connected to said circuit having programmable digital logic states to preset the digital logic states into a known state on power-up.

35. The programmable device of claim 34, wherein said circuitry to preset the digital logic states into a known state on power-up comprises an undervoltage lock out circuit.

36. A programmable device fabricated on a single semiconductor chip, comprising:

a circuit having programmable digital logic states;

a plurality of input/output pins;

a plurality of analog circuits, each having an analog input and an analog output;

a plurality of configurable interconnectivity controlling circuits to enable one of said input/output pins selectively connected to one of at least two of said analog circuits;

and said circuit having programmable digital logic states being connected to said plurality of interconnectivity controlling circuits to connect a selected one of said input/output pins to a selected one of said one analog circuits in accordance with the programmable digital logic states, and wherein the configurable interconnectivity controlling circuitry comprises one-time programmable elements.

37. The programmable device of claim 36, wherein the configurable interconnectivity controlling circuitry comprises programmable elements that are reprogrammable.

38. The programmable device of claim 36, wherein the configurable interconnectivity controlling circuitry comprises a plurality of switches.

39. A programmable device fabricated on a single semiconductor chip, comprising:

a circuit having programmable digital logic states;

a plurality of input/output pins;

a plurality of analog circuits, each having an analog input and an analog output;

a plurality of configurable interconnectivity controlling circuits to enable one of said input/output pins selectively connected to one of at least two of said analog circuits;

and said circuit having programmable digital logic states being connected to said plurality of interconnectivity controlling circuits to connect a selected one of said input/output pins to a selected one of said one analog circuits in accordance with the programmable digital logic states, and wherein the configurable interconnectivity controlling circuitry comprises a plurality of switches, and wherein each of said switches comprises a switch network to form switch networks.

40. The programmable device of claim 39, wherein a number of analog circuits are provided sufficient to provide a redundant number of analog circuits with respect to a number of input/output pins, whereby the number of analog switches which are needed to provide each device pin with connections to a multiplicity of analog circuits is reduced.

41. The programmable device of claim 40, wherein the analog circuits are arranged such that each input/output pin is selectively connectable to a subset of all of said analog circuits, and each of said analog circuits is selectively connectable to a subset of all of the input/output pins.

42. The programmable device of claim 40, further wherein said programmable device comprises interconnection paths to the analog circuits, said interconnection paths being arranged to form a symmetrical network.

43. The programmable device of claim 42, wherein the switch networks are arranged to provide each input/output pin with a connection to an inverting input of an analog circuit, a noninverting input of an analog circuit, an output of an analog circuit.

44. The programmable device of claim 43, wherein said programmable device further comprises additional switch networks arranged to connect an on-chip voltage reference to selected inputs of each analog circuit.

45. The programmable device of claim 39, wherein at least one of said switch networks are connected to selectively route digital data to bypass said analog circuit.

46. The programmable device of claim 39, wherein said circuit has said digital logic states controlling at least some of said switch networks to connect outputs of selected analog circuits to inputs of selected analog circuits without passing through any of said input/output pins.

47. A programmable device fabricated on a single semiconductor chip, comprising:

a circuit having programmable digital logic states;

a plurality of input/output pins;

a plurality of analog circuits, each having an analog input and an analog output;

a plurality of configurable interconnectivity controlling circuits to enable one of said input/output pins selectively connected to one of at least two of said analog circuits;

and said circuit having programmable digital logic states being connected to said plurality of interconnectivity controlling circuits to connect a selected one of said input/output pins to a selected one of said one analog circuits in accordance with the programmable digital logic states, and wherein each analog circuit comprises a plurality of analog circuit blocks.

48. The programmable device of claim 47, wherein each analog circuit comprises an operational amplifier.

49. The programmable device of claim 47, wherein each analog circuit comprises a voltage comparator circuit.

50. The programmable device of claim 47 wherein at least some of said plurality of analog circuits are contained in an input/output module, each input/output module comprising a plurality of circuits that are each selectively configurable either as an operational amplifier or a comparator.

51. A programmable device fabricated on a single semiconductor chip, comprising:

a circuit having programmable digital logic states;

a plurality of input/output pins;

a plurality of analog circuits, each having an analog input and an analog output;

a plurality of configurable interconnectivity controlling circuits to enable one of said input/output pins selectively connected to one of at least two of said analog circuits;

and said circuit having programmable digital logic states being connected to said plurality of interconnectivity controlling circuits to connect a selected one of said input/output pins to a selected one of said one analog circuits in accordance with the programmable digital logic states, and wherein at least some of said plurality of analog circuits are contained in an input/output module, each input/output module comprising a plurality of circuits that are each selectively configurable either as an operational amplifier or a comparator.

52. The programmable device of claim 51, wherein each module comprises four analog circuits that are each selectively configurable either as an operational amplifier or a comparator, and wherein said four circuits have are connected to four input/output pins through a plurality of switches.

53. The programmable device of claim 51, wherein the plurality of analog circuits are interconnected by analog signal paths whose interconnectivity is determined by the programmable digital logic states.

54. The programmable device of claim 51, wherein at least some of said signal paths interconnect outputs of at least some of said analog circuits to inputs of at least one of said analog circuits entirely on chip.

55. The programmable device of claim 51, wherein a plurality of switches are arranged to connect each of said input/output pins to at least one input of at least one of said analog circuits and at least one output of one of said analog circuits.

56. A programmable device fabricated on a single semiconductor chip, comprising: a circuit having digital logic states;

a circuit having functional logic states;

a plurality of input/output pins;

an analog circuit having an input and an output;

a transmission gate connected to receive the digital logic states to selectively connect the input/output pins to said circuit having functional logic states;

and an analog switch connected to receive the digital logic states to selectively connect the input/output pins to said analog circuit in accordance with said digital logic states, and wherein said programmable device further comprise a tristate digital output driver connected to an input/output pin and at least a further analog switch connecting said input/output pin to an analog circuit, said analog switch operated in response to said digital logic states to selectively isolate said input/output pin, wherein said pin can be isolated from the analog circuit, and can function as a digital output by virtue of the connection to the digital output driver.

57. The programmable device of claim 56, wherein said circuit has said programmable digital logic states being user programmable.

58. The programmable device of claim 56, wherein said programmable device further comprise circuitry connected to said circuit having digital logic states to preset the digital logic states into a known state on power-up.

59. The programmable device of claim 58, wherein said circuitry to preset the digital logic states into a known state on power-up comprises an undervoltage lock out circuit.

60. A user programmable analog device on a single semiconductor chip, comprising: a user programmable digital logic array formed in said semiconductor chip;

said programmable digital logic array producing configuration signals in a configuration logic portion and data processing functions in a functional logic portion;

a plurality of analog circuits also fabricated in the semiconductor chip;

circuitry for selectively configuring the interconnections and function of said at least one of the analog circuits in accordance with the configuration signals;

and circuitry for producing data processed in accordance with said data processing functions, and, wherein at least one of said plurality of analog circuits comprise a circuit that is selectively configurable either as an operational amplifier or a comparator in accordance with said configuration signals.

61. The user programmable analog device of claim 60, wherein the digital logic array is a circuit selected from the group of circuits comprising a PLA, an FPLA, a PGA, a PLD, and an FPGA.

62. The user programmable analog device of claim 60, wherein at least one of said plurality of analog circuits comprise an operational amplifier.

63. The user programmable analog device of claim 60, wherein at least one of said plurality analog circuits comprise a comparator circuit.

64. A user programmable analog device on a single semiconductor chip, comprising: a user programmable digital logic array formed in said semiconductor chip;

said programmable digital logic array producing configuration signals in a configuration logic portion and data processing functions in a functional logic portion;

a plurality of analog circuits also fabricated in the semiconductor chip:

circuitry for selectively configuring the interconnections and function of said at least one of the analog circuits in accordance with the configuration signals;

and circuitry for producing data processed in accordance with said data processing functions, and, wherein at least one of said plurality of analog circuits are formed in an input/output module, said input/output module comprising a plurality of circuits being selectively configurable either as an operational amplifier or a comparator in accordance with said configuration signals.

65. The user programmable analog device of claim 64, wherein each module comprising four analog circuits, each being selectively configurable either as an operational amplifier or a comparator, and wherein said four circuits are connected to four input/output pins through a plurality of switches.

66. The user programmable analog device of claim 65, wherein said plurality of switches are arranged to connect each of said input/output pins to at least one input of at least one of said analog circuits and at least one output of one of said analog circuits.

67. The user programmable analog device of claim 66, wherein said user programmable only device further comprising a plurality of bypass lines and a corresponding plurality of switches in series with said bypass lines to selectively bypass digital signals around at least some of said four circuits.

68. A programmable integrated circuit on a single semiconductor chip, said circuit being powered by an externally applied power supply voltage, comprising:

a plurality of analog input and output circuits for receiving and delivering analog input and output signals, said analog input and output circuits being capable of being configured to provide a number of circuit functionalities;

a plurality of switches for selectively configuring said analog input and output circuits to provide a selected circuit functionality from among said number of circuit functionalities;

a digital logic circuit for providing configuration signals for operating said plurality of switches to configure said analog input and output circuits to provide said selected circuit functionalities;

a programmable digital circuit for performing digital functions and producing a digital circuit output signal;

an analog voltage reference circuit connected to receive the power supply voltage to produce an essentially constant reference voltage output over a range of voltages of said power supply voltage, said reference voltage being selectable by said configuration signals; and said reference voltage output being connected to provide a reference voltage to at least one of said analog input and output circuits.

69. The programmable integrated circuit of claim 68, wherein said programmable integrated circuit further comprise a timer circuit connected to provide timing signals to said programmable digital circuit.

70. The programmable integrated circuit of claim 68, wherein the programmable digital circuit further comprises a counter circuit.

71. The programmable integrated circuit of claim 68, wherein the analog voltage reference circuit comprises: a voltage reference circuit;

a resistor ladder having a plurality of nodes therealong;

a transistor, said resistor ladder and said transistor being connected in series from said externally applied power supply voltage to a reference potential, said transistor having a current flow path controlled by said voltage reference circuit to impose a controlled reference voltage across the resistor ladder;

and a plurality of switches operated by said configuration signals, connected to select among said plurality of nodes of said resistor ladder for delivery to provide said essentially constant reference voltage of a selectable magnitude at an output of said analog voltage reference circuit.

72. The programmable integrated circuit of claim 71, wherein said programmable integrated circuit further comprises at least one voltage divider connected between said output of said analog voltage reference circuit and a reference potential, said at least one voltage divider providing a divided output voltage at a junction node therein, wherein a resistor of said voltage divider is user adjustable.

73. The programmable integrated circuit of claim 68, wherein at least one of said plurality of analog input and output circuits comprise an operational amplifier.

74. The programmable integrated circuit of claim 68, wherein at least one of said plurality of analog input and output circuits comprise a comparator circuit.

75. The programmable integrated circuit of claim 68, wherein at least one of said plurality of analog input and output circuits comprise a circuit that is selectively configurable either as an operational amplifier or a comparator.

76. The programmable integrated circuit of claim 68, wherein at least one of said plurality of analog input and output circuits are formed in an input/output module, said input/output module comprising a plurality of circuits being selectively configurable either as an operational amplifier or a comparator.

77. The programmable integrated circuit of claim 76, wherein each module comprises four analog circuits each being selectively configurable either as an operational amplifier or a comparator, and wherein said four analog circuits are connected to four input/output pins through a plurality of switches.

78. The programmable integrated circuit of claim 77, wherein said plurality of switches are arranged to connect each of said input/output pins to at least one input of at least one of said analog circuits and at least one output of one of said analog circuits.

79. The programmable integrated circuit of claim 78, wherein each circuit input is connected to inputs of at least two of said four circuits.

80. The programmable integrated circuit of claim 78, further comprising a plurality of bypass lines and a corresponding plurality of switches in series with said bypass lines to selectively bypass at least some of said four circuits.

* * * * *